United States Patent
Nguyen et al.

(10) Patent No.: US 12,287,442 B2
(45) Date of Patent: Apr. 29, 2025

(54) AUTOMATED FAULT SEGMENT GENERATION

(71) Applicant: Landmark Graphics Corporation, Houston, TX (US)

(72) Inventors: Xuan Nam Nguyen, Houston, TX (US); Sinan Tufekci, Houston, TX (US); Alejandro Jaramillo, Edinburgh (GB)

(73) Assignee: Landmark Graphics Corporation, Houston, TX (US)

( * ) Notice: Subject to any disclaimer, the term of this patent is extended or adjusted under 35 U.S.C. 154(b) by 114 days.

(21) Appl. No.: 17/738,247

(22) Filed: May 6, 2022

(65) Prior Publication Data
US 2023/0358910 A1 Nov. 9, 2023

(51) Int. Cl.
*G01V 1/30* (2006.01)
*E21B 44/00* (2006.01)
(Continued)

(52) U.S. Cl.
CPC .............. *G01V 1/301* (2013.01); *E21B 44/00* (2013.01); *E21B 49/00* (2013.01);
(Continued)

(58) Field of Classification Search
CPC .. G01V 1/301; G01V 2210/642; G01V 1/288; G01V 1/345; G01V 2210/65;
(Continued)

(56) References Cited

U.S. PATENT DOCUMENTS 5,930,730 A * 7/1999 Marfurt .................. G01V 1/301
702/16
6,018,498 A * 1/2000 Neff ....................... G01V 1/288
367/72
(Continued)

FOREIGN PATENT DOCUMENTS

EP 1110104 B1 10/2003

OTHER PUBLICATIONS

Hale; "Fault surfaces and fault throws from 3D seismic images"; Center for Wave Phenomena, Colorado School of Mines; 2013; 5 pgs.
(Continued)

*Primary Examiner* — Akash Saxena
(74) *Attorney, Agent, or Firm* — Michael Jenney; Parker Justiss, P.C.

(57) ABSTRACT

The disclosure presents processes to automatically generate one or more set of fault segments from a fault plane pointset. The processes can identify a predominant direction and derive a set of fault segments from the fault plane pointset, where the fault segments are generated by using slices of data from the fault plane pointset that are perpendicular to the predominant direction. For each slice of data, the fault segments can be analyzed with neighboring fault segments to determine if they are overlapping. Fault segments that block or overlap other fault segments can be assigned to a different subset of fault segments from the underlying fault segments. Gaps in the fault plane pointset, and the resulting set of fault segments, can be filled in by merging neighboring fault segments above and below the gap if the neighboring fault segments satisfy a criteria for filling the gap.

23 Claims, 15 Drawing Sheets

(51) Int. Cl.
*E21B 49/00* (2006.01)
*G06F 17/18* (2006.01)
*G06F 30/20* (2020.01)

(52) U.S. Cl.
CPC .... *E21B 2200/22* (2020.05); *G01V 2210/642* (2013.01); *G06F 17/18* (2013.01); *G06F 30/20* (2020.01)

(58) Field of Classification Search
CPC . G01V 1/30; G01V 1/302; G01V 1/34; G01V 2210/646; G01V 20/00; G01V 1/306; G01V 1/307; G01V 2210/641; G01V 2210/667; G01V 1/50; G01V 2210/64; G06F 17/18; G06F 30/20
See application file for complete search history.

(56) References Cited

U.S. PATENT DOCUMENTS

| | | | |
|---|---|---|---|
| 7,069,149 B2* | 6/2006 | Goff | G01V 1/30 |
| | | | 702/16 |
| 7,330,791 B2* | 2/2008 | Kim | G01V 1/32 |
| | | | 702/16 |
| 7,627,429 B2* | 12/2009 | Li | G01V 1/30 |
| | | | 702/14 |
| 9,377,546 B2* | 6/2016 | Vallikkat Thachaparambil | G01V 1/282 |
| 9,542,507 B2* | 1/2017 | Bø | G01V 1/288 |
| 9,618,639 B2* | 4/2017 | Witte | G01V 1/34 |
| 10,139,508 B1* | 11/2018 | Lemus | G01V 1/301 |
| 10,628,552 B2* | 4/2020 | Shi | G01V 20/00 |
| 11,409,023 B2* | 8/2022 | Bi | G06F 30/20 |
| 2013/0226545 A1* | 8/2013 | Bo | G01V 1/301 |
| | | | 703/6 |
| 2013/0229891 A1* | 9/2013 | Witte | G01V 1/34 |
| | | | 367/9 |
| 2013/0294197 A1 | 11/2013 | Vallikkat Thachaparambil et al. | |
| 2014/0098633 A1* | 4/2014 | Ma | G01V 1/345 |
| | | | 367/25 |
| 2014/0098639 A1* | 4/2014 | Ma | G01V 1/34 |
| | | | 367/73 |
| 2015/0117151 A1* | 4/2015 | Curry | G01V 1/301 |
| | | | 367/43 |
| 2016/0018542 A1 | 1/2016 | Maerten et al. | |
| 2016/0020370 A1 | 7/2016 | Wang et al. | |
| 2016/0202370 A1* | 7/2016 | Wang | G01V 1/282 |
| | | | 702/14 |
| 2017/0097429 A1* | 4/2017 | Shetty | G01V 1/288 |
| 2018/0119532 A1* | 5/2018 | Ma | G01V 1/42 |
| 2018/0187521 A1* | 7/2018 | Surjaatmadja | G05B 17/02 |
| 2018/0336309 A1* | 11/2018 | Shi | G01V 20/00 |
| 2019/0063205 A1* | 2/2019 | Omeragic | G01V 3/28 |
| 2019/0243017 A1* | 8/2019 | Klinger | G01V 1/301 |
| 2020/0064507 A1* | 2/2020 | Mao | G01V 1/28 |
| 2020/0200931 A1* | 6/2020 | Mao | G01V 1/301 |
| 2020/0248545 A1* | 8/2020 | Maus | E21B 47/022 |
| 2021/0181362 A1* | 6/2021 | Jiang | G06V 10/82 |
| 2021/0247535 A1* | 8/2021 | Fitz-Gerald | G01V 1/306 |
| 2022/0018982 A1* | 1/2022 | Rueger | G06V 10/761 |
| 2022/0163692 A1* | 5/2022 | Harris | G01V 1/301 |
| 2022/0229199 A1* | 7/2022 | Li | G01V 1/302 |
| 2022/0413173 A1* | 12/2022 | Jiang | G06N 3/0464 |
| 2023/0117096 A1* | 4/2023 | Nguyen | G01V 1/302 |
| | | | 702/14 |

OTHER PUBLICATIONS

Wu, et al.; "Automatically interpreting all faults, unconformities, and horizons from 3D seismic images"; ResearchGate; Article in Interpretation; May 2016; 11 pgs. https://www.researchgate.net/publication/301360046.

Zhang, et al.; "Automatic seismic fault surfaces construction using seismic discontinuity attribute"; Society of Exploration Geophysicists; SEG International Exposition and 90th Annual Meeting; 2020; 5 pgs.

Mora, et al.; "Fault surface objects from fault probability volumes using active contours"; Society of Exploration Geophysicists; First International Meeting for Applied Geoscience & Energy; 2021; 5 pgs.

* cited by examiner

AUTOMATED FAULT SEGMENT GENERATION

TECHNICAL FIELD

This application is directed, in general, to analyzing seismic data of a subterranean formation and, more specifically, to determining faults within the subterranean formation.

BACKGROUND

In developing a reservoir system or in planning a drilling operation through a subterranean formation, it is beneficial to plan the drilling path of a borehole. The path can be to drill through a fault area or to avoid a portion of the subterranean formation. Knowing where the faults lie and their orientation, can be helpful in planning the drilling operations. There can be one or more faults, they can overlap, partially overlap, have different angles of inclination, and different shapes. Conventionally, seismic data is collected and analyzed to determine characteristic of these subterranean faults and the types of rock to be expected downhole. The seismic data can be utilized to compute fault attribute volume for extracting a fault plane pointset that represents one or more faults within the fault area. The analyzation of the fault plane pointset, to determine one or more sets of fault segments, is typically done manually. This can lead to a slower response time and a reduction in the accuracy and consistency of the analysis results. Being able to automate the generation and identification of fault segments would be beneficial.

SUMMARY

In one aspect, a method is disclosed. In one embodiment, the method includes (1) receiving a fault plane pointset and input parameters, wherein the fault plane pointset is information collected from a seismic volume, and the fault plane pointset represents a portion of a subterranean formation, (2) identifying a predominant fault plane direction using the fault plane pointset, (3) generating a set of fault segments wherein the set of fault segments are generated using the input parameters and slices of data from the fault plane pointset that are perpendicular to the predominant fault plane direction, and (4) using a fault segment processor to determine existence of zero or more pairs of overlapping fault segments and generate one or more subsets of fault segments using the set of fault segments and the input parameters, wherein each subset of fault segments in the one or more subsets of fault segments represents a fault plane in the subterranean formation, where two or more fault segments from the set of fault segments are assigned to form a subset of fault segments, and the two or more fault segments satisfy a merge criteria specified in the input parameters.

In a second aspect, a system is disclosed. In one embodiment, the system includes (1) a data transceiver, capable of receiving a fault plane pointset and input parameters, wherein the fault plane pointset is data collected from one or more seismic sensors of a subterranean formation, and (2) a fault segment processor, capable of communicating with the data transceiver, identifying a direction of a predominant fault plane of the fault plane pointset, generating a set of fault segments using the fault plane pointset and the predominant fault plane, and generating one or more subsets of fault segments using the set of fault segments and the input parameters.

In a third aspect, a computer program product having a series of operating instructions stored on a non-transitory computer-readable medium that directs a data processing apparatus when executed thereby to perform operations to determine one or more fault segments is disclosed. In one embodiment, the operations include (1) receiving a fault plane pointset and input parameters, wherein the fault plane pointset is information collected from a seismic volume, and the fault plane pointset represents a portion of a subterranean formation, (2) identifying a predominant fault plane direction using the fault plane pointset, (3) generating a set of fault segments wherein the set of fault segments are generated using the input parameters and slices of data from the fault plane pointset that are perpendicular to the predominant fault plane direction, and (4) directing a fault segment processor to determine existence of zero or more pairs of overlapping fault segments and generate one or more subsets of fault segments using the set of fault segments and the input parameters, wherein each subset of fault segments in the one or more subsets of fault segments represents a fault plane in the subterranean formation, where two or more fault segments from the set of fault segments are assigned to form a subset of fault segments, and the two or more fault segments satisfy criteria specified in the input parameters.

BRIEF DESCRIPTION

Reference is now made to the following descriptions taken in conjunction with the accompanying drawings, in which.

DETAILED DESCRIPTION

Figure 1A:
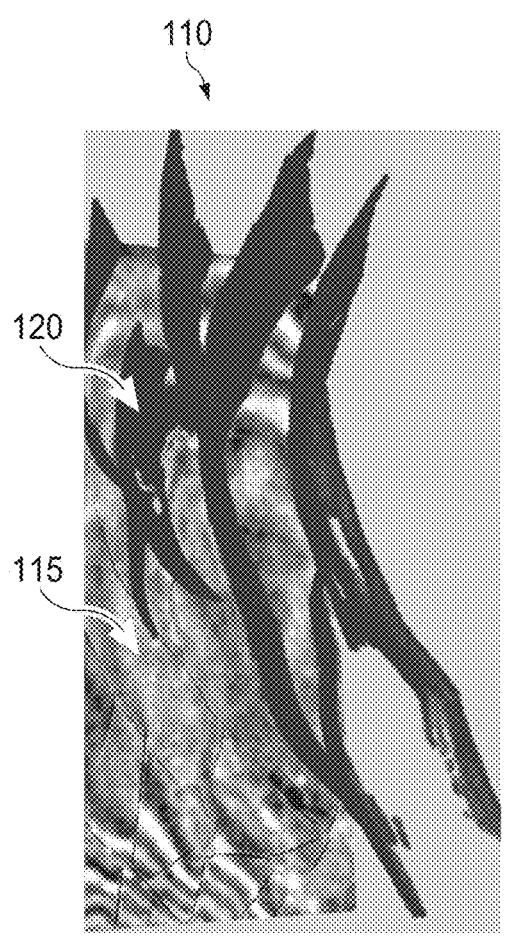
FIGS. 1A-1B are illustrations of diagrams of an example complex fault system.

In evaluating drilling locations, fault data is often used to identify the potential types of subterranean formations in the reservoir area. The fault data can be utilized to plan a drilling operation, a drilling path, and drilling avoidance areas of the subterranean formation. The drilling operation can be for various operations, for example, hydrocarbon well site development, scientific operations, exploration operations, and other types of drilling operations.

The fault data can be collected from various sensors, for example, one or more seismic sensors. The fault data, i.e., the fault attribute volume or seismic volume (such as fault likelihood and fault probability), can be used to extract one or more fault plane pointsets. A fault plane pointset can represent one or more faults that exist in the subterranean formations. For effective subsurface interpretation and modeling workflows to aid in hydrocarbon exploration and extraction it can be beneficial to transform the extracted fault plane pointset to one or more sets of fault segments, wherein each set of fault segments represents a fault plane in the subterranean formation.

Conventionally, the generation of the fault plane pointset and subsequent fault segments is generated through a manual effort by a user. Automating the process would be beneficial, such as improving the consistency of data interpretation, and decreasing the time to generate the result. A user performing the generation of fault segments can take days or weeks depending on the complexity of the fault data and faults within the subterranean formation. The proposed automated process can be completed in seconds to minutes.

This disclosure presents processes that receive fault plane pointset, and can automatically output result parameters such as one or more subsets of fault segments of one or more fault planes. Automated extraction of fault planes can be critical for the identification of hydrocarbon bearing formations, improving structural trapping definition, or preventing drilling hazards. The fault plane pointset contains a set of fault data points, e.g., a set of fault samples. Each fault sample of a set of fault samples can include positioning attributes such as inline value, crossline value, and depth value. Additionally, each fault sample can include other attributes such as amplitude value, vertical thickness value, dip value, and azimuth values. The predominant direction, i.e., inline or crossline direction, of the input fault plane pointset can be determined by analyzing the fault samples such as using a median value of azimuths from the fault samples, e.g., determining the predominant fault plane direction. The fault plane pointsets can be transformed to a set of slices of data using input parameter trace increment. Each slice of data is a subset of the fault samples from the fault plane pointset, where the subset of the fault samples follows a vertical plane that is perpendicular to the identified predominant direction.

Within each slice of data, a fault segment can be a connected subset of neighboring fault samples from the set of fault samples, where the subset of fault samples have a similar orientation and other attributes. Other fault segments can be generated using other subsets from the set of fault samples. The one or more fault segments then can be representative of the faults in the subterranean formation. Fault segments can represent the slope of a fault plane. A fault segment typically consists of at least two fault samples. Due to geological complexity and data quality limitations, the auto-extracted fault plane pointset can contain multiple geological fault planes that need to be distinguished. In some aspects, the disclosed processes can generate the fault segments that can distinguish multiple geological fault planes. In some aspects, the disclosed processes can fill in some or many holes or gaps that can exist within the input fault plane pointset.

The result parameters can be communicated to other systems and used as inputs to other processes. For example, the result parameters can be used as an input to plan a drilling operation or to direct the drilling operations of a drilling system. The drilling planning can include areas to avoid in the subterranean formation, such as a potential high pressure interval. The disclosed processes can be performed prior to the start of drilling operations or after drilling operations have begun. For example, fault data can be collected from sensors downhole a borehole and the result parameters can be used as inputs to a geo-steering system.

In some aspects, the result parameters can be compared to other collected data to verify the analysis results. For example, other sensor data, such as magnetic resonance data, can be utilized to validate the result parameters from the disclosed parameters. If there is a significant difference between the result parameters and the other sensor data, then either or both sets of data can be reviewed for potential errors and corrections.

By integrating the disclosed processes for automating the fault segment generation from fault plane pointsets, a complete and robust cloud-based assisted fault interpretation can be provided to customers. The fault segment generation can provide increased accuracy with a faster time to generate the result parameters than conventional methods. This can allow users to concentrate on the geological implications of the new fault interpretation. As a result, users can make better production and exploration decisions to maximize efficiency, and minimize cost and risk, as compared to conventional solutions.

Previous solutions have not extended to generating fault segments nor to the handling of complex overlapping of fault plane in which one part of the plane lies in front of other parts of that same plane. The disclosed processes can generate non-overlapping and overlapping fault segments on each slice of data of the set of slices of data forming the result parameter fault segments.

For each slice of data identified, the processes can generate the fault segments by connecting fault samples that are in close proximity along a similar slope and that have a similar dip and azimuth attributes if dip and azimuth attributes exist. The processes can use input parameters, such as an offset parameter (specifying a maximum lateral distance between fault sticks), a maximum time difference or depth difference parameter (specifying a time distance or depth distance between fault samples, where time is the seismic wave time), a maximum slope parameter (specifying a slope difference), a maximum dip parameter (specifying a dip difference), a maximum azimuth parameter (specifying an azimuth difference), a gap height parameter (used to determine fault segments that can be merged), a maximum distance difference parameter (used to determine fault segments that can be merged when a linear measurement is used), a maximum time difference parameter (used to determine fault segments that can be merged when seismic time is used). The input parameters can be expressed as a number, a percentage difference, or other statistical algorithm for identifying whether a nearby fault stick satisfies the criteria compared to another fault stick to be combined. Each input parameter can utilize the same, different, or a combination of the statistical algorithms.

In some aspects, conventional network analysis techniques, such as one or more network analysis algorithms, can be employed to decompose a complex fault plane pointset that consists of multiple geological faults into different geological faults. For example, the processes can identify pairs of overlapping segments on the same slice of data that cannot be assigned to the same geological fault. The processes can identify pairs of assigning segments from two adjacent slices of data that overlap in depth and that are within the shape parameter difference and within the lateral separation parameter difference. The assigned faults, e.g., subsets of fault segments, can be extracted as the connected components of a network in which the nodes can be each fault segment, the edge can be each pair of assigning segments, and all connected components do not contain a pair of blocking segments.

In some aspects, the continuity of the geological fault can be improved by merging aligned fault segments into a larger fault segment thereby effectively filling in gaps or holes within the assigned fault plane. For example, the processes can identify non-overlapping fault segments from the same slice of data that satisfy the criteria for merging, and merge them into a larger fault segment effectively filling in the gaps between the two original fault segments. The fault samples within the merged fault segment can be regularized using user-defined depth increments for effective quality control and editing. In aspects where the two original fault segments are at different depths, then the regularization can utilize various algorithms to determine the depth to be assigned for the portion of the fault segment that is filled in for the gap. Algorithms that can be used can be a mean (using a mean parameter), an average (using an average parameter), a median (using a median parameter), a user provided depth increment (using a depth increment parameter) to step the fault segment portion covering the gap from one of the original fault segments to the other, or other types of algorithms can be utilized.

Figure 1B:
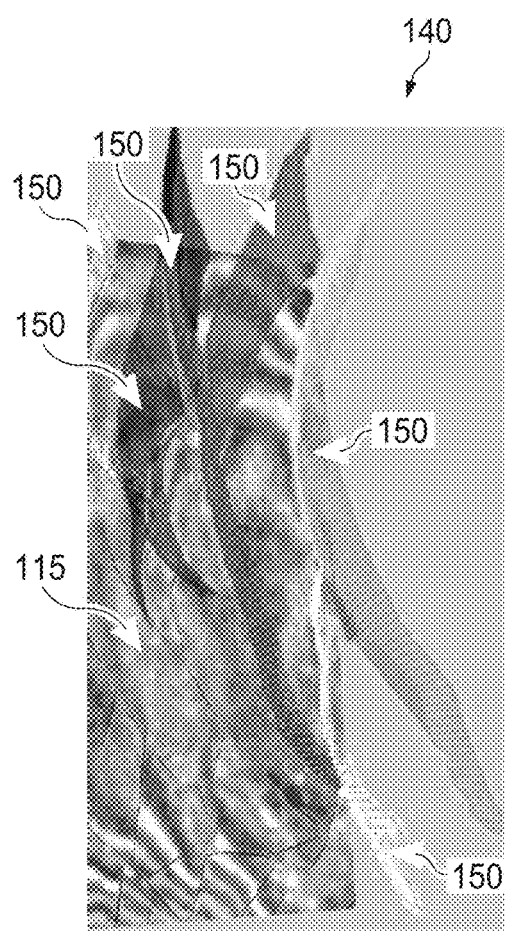

Turning now to the figures, FIGS. 1A-1B are illustrations of diagrams of an example complex fault system 110 and complex fault system 140. Complex fault system 110 shows a horizontal slice of seismic data indicating a subterranean formation fault system 115 with a web of dark lines indicating the fault lines. Overlaid subterranean formation fault system 115 are several swaths of gray indicating a complex fault plane pointset that includes complex fault plane pointset 120. An analysis is conducted on the complex fault plane pointset 120 to generate discreet sets of fault segments 150 in complex fault system 140. Discreet sets of fault segments 150 show how each fault segment aligns with the other fault segments, such as a depth order and a lateral positioning. Being able to auto-generate discreet sets of fault segments 150 would allow the analysis to be completed faster than using a manual user method, along with more accuracy and consistency.

Figure 1C:
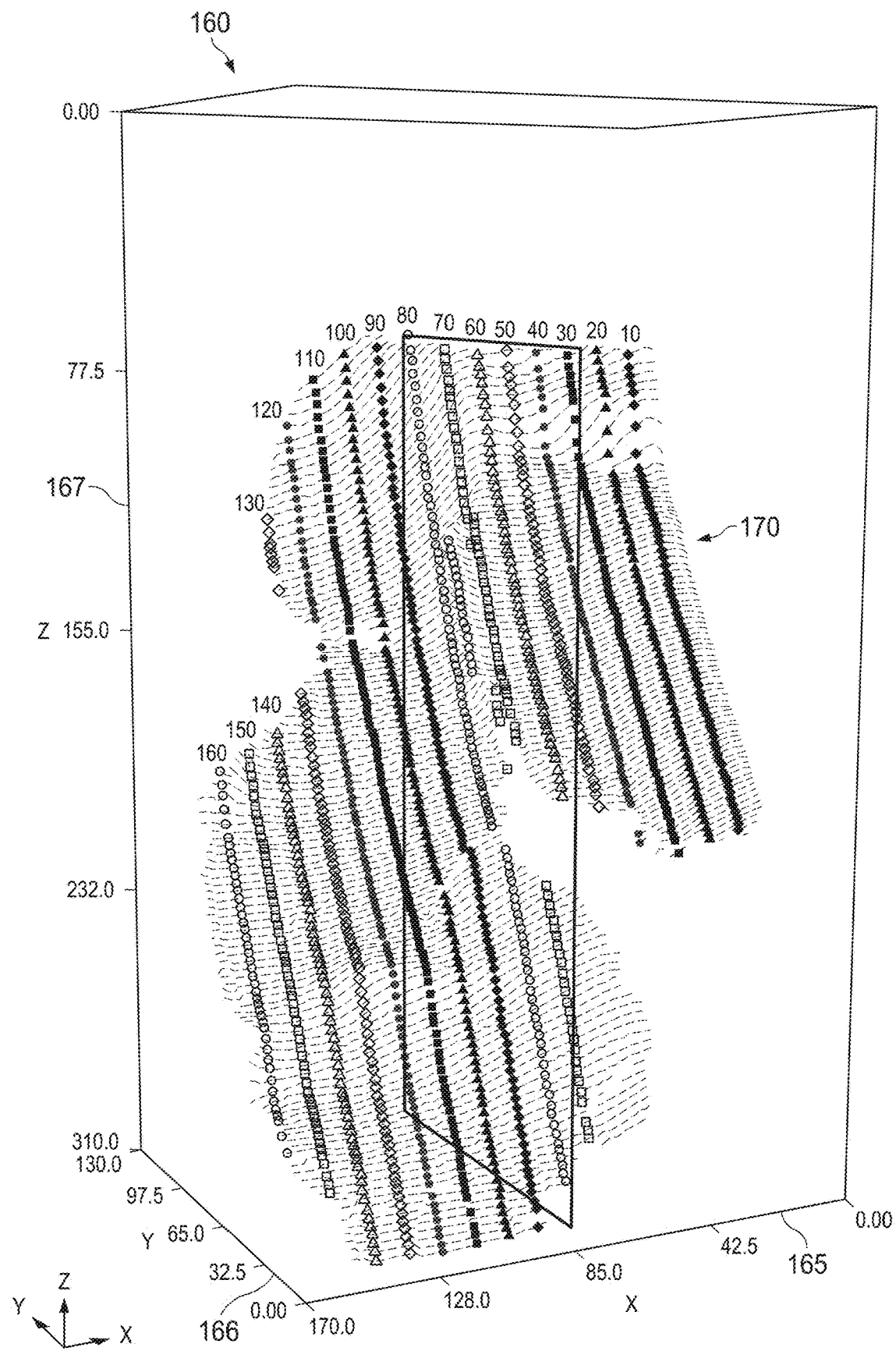
FIG. 1C is an illustration of a diagram of an example graph demonstrating a fault pointset transformation to a set of slices of data.

FIG. 1C is an illustration of a diagram of an example graph 160 demonstrating a fault pointset transformation to a set of slices of data. An x-axis 165 is shown, using seismic traces as the units along inline direction of the seismic attribute volume. A y-axis 166 is shown, using seismic traces as the units along an orthogonal crossline direction to the x-axis of the seismic attribute volume. A z-axis 167 is shown, using milliseconds as the units. In other aspects, x-axis 165, y-axis 166, and z-axis 167 can be represented as linear measurements, such as feet, meters, or another linear measurement type.

Slices of data 170 are subsets of the fault samples extracted from the fault plane pointset along crossline direction in the y-axis and are shown using a trace increment of 10. The predominant direction of the fault plane pointset, e.g., axis, is inline in the x-axis.

FIGS. 2A-2D are illustrations of diagrams of example graphs 200 demonstrating a fault plane pointset transformation to one or more sets of fault segments. Graphs 200 has a graph 210 with a horizontal slice of seismic attribute volume 220 on a subterranean formation when looking top down on the subterranean formation. An x-axis 215 is shown, using seismic traces as the units along inline direction of horizontal slice of seismic attribute volume 220. A y-axis 216 is shown, using seismic traces as the units along an orthogonal crossline direction to the x-axis of horizontal slice of seismic attribute volume 220. A z-axis 217 is shown, using milliseconds as the units, perpendicular to horizontal slice of seismic attribute volume 220. In other aspects, x-axis 215, y-axis 216, and z-axis 217 can be represented as linear measurements, such as feet, meters, or another linear measurement type.

A fault plane pointset 222, consisting of one or more fault samples, can be received, such as from other systems, data stores, sensors, or other systems. Conventional means can be used to collect and communicate fault plane pointset 222. Fault plane pointset 222 can be used as the input data set for the disclosed processes. In FIG. 2B, a graph 230 shows the same graphing system as in FIG. 2A. Fault plane pointset 222 has now been transformed into fault segments 232 representing the slope of the input fault plane pointset along its predominant axis.

Figure 2A:
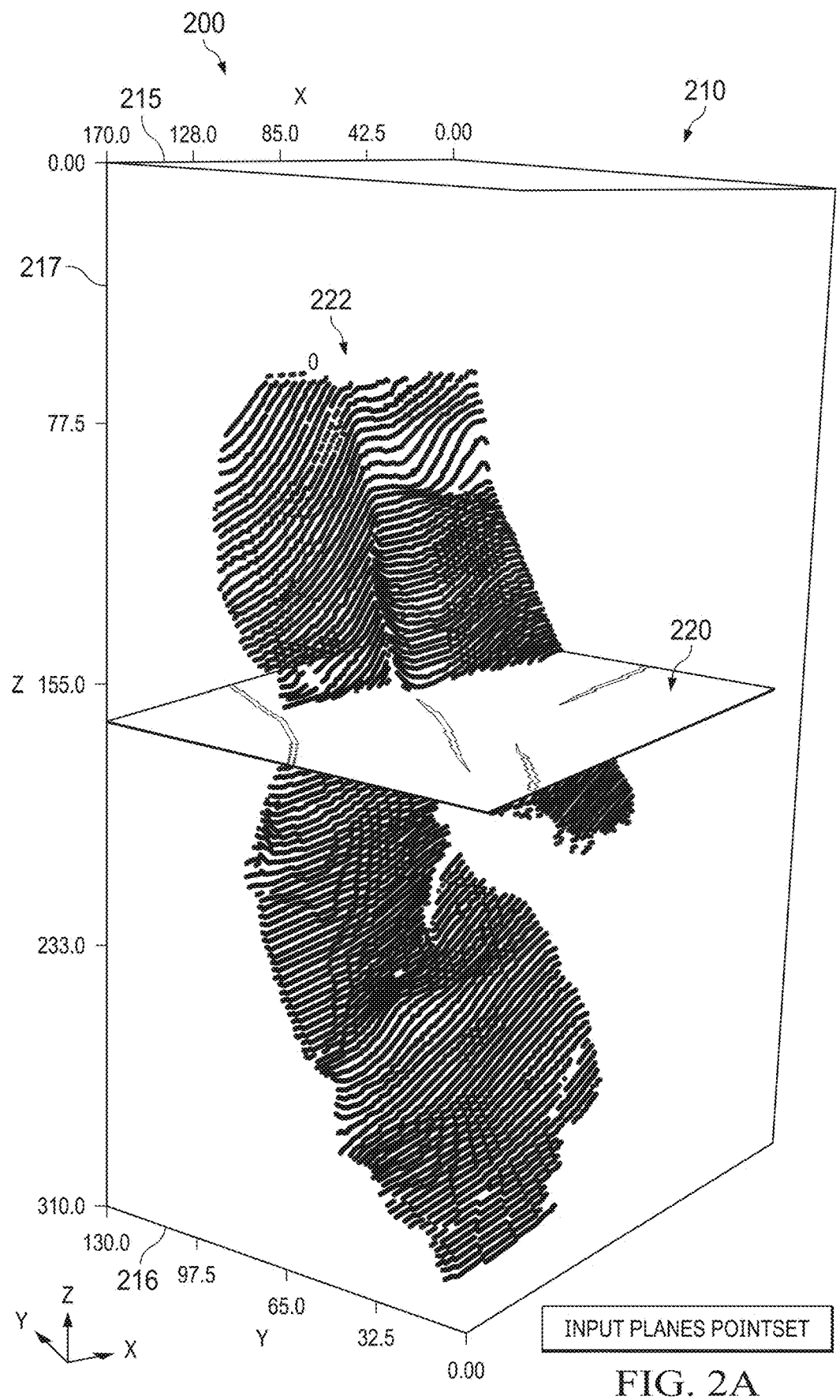
FIGS. 2A-2D are illustrations of diagrams of example graphs demonstrating a fault pointset transformation to one or more sets of fault segments.
Figure 2B:
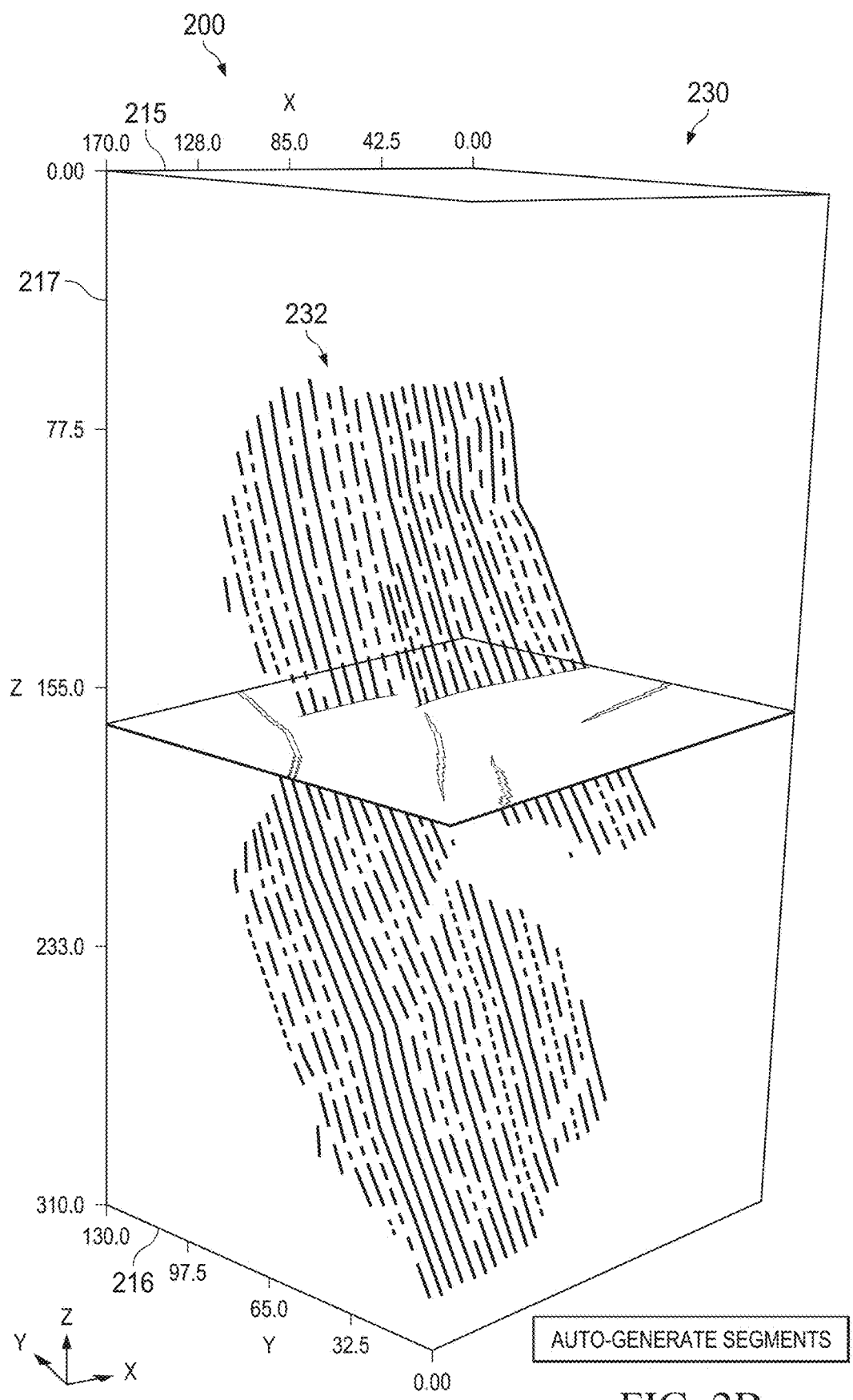
Figure 2C:
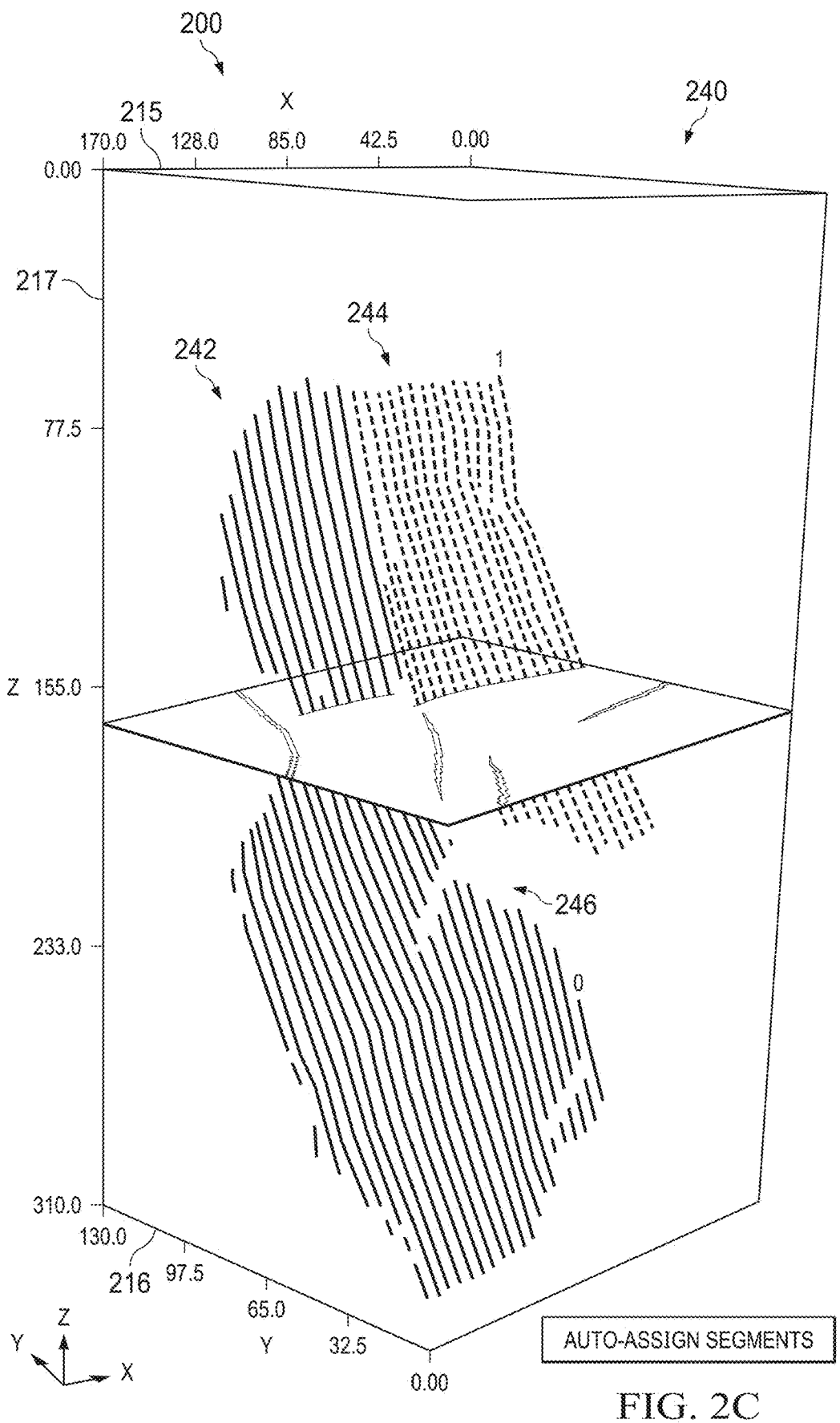

In FIG. 2C, a graph 240 shows the same graphing system as in FIG. 2A. Fault segments 232 are now shown grouped according to the fault planes for which they have been assigned. A fault plane 244 partially overlaps a fault plane 242. The processes have determined that the lateral separation, slope, shape, and other parameters of each subset of fault segments 232 are within the proscribed merge criteria as specified by the input parameters to generate fault plane 242 and fault plane 244. A gap, e.g., hole, in fault plane 242 is shown as fault gap 246. A gap may occur due to data gathering issues, data processing issues, or complexity within the subterranean formation.

Figure 2D:
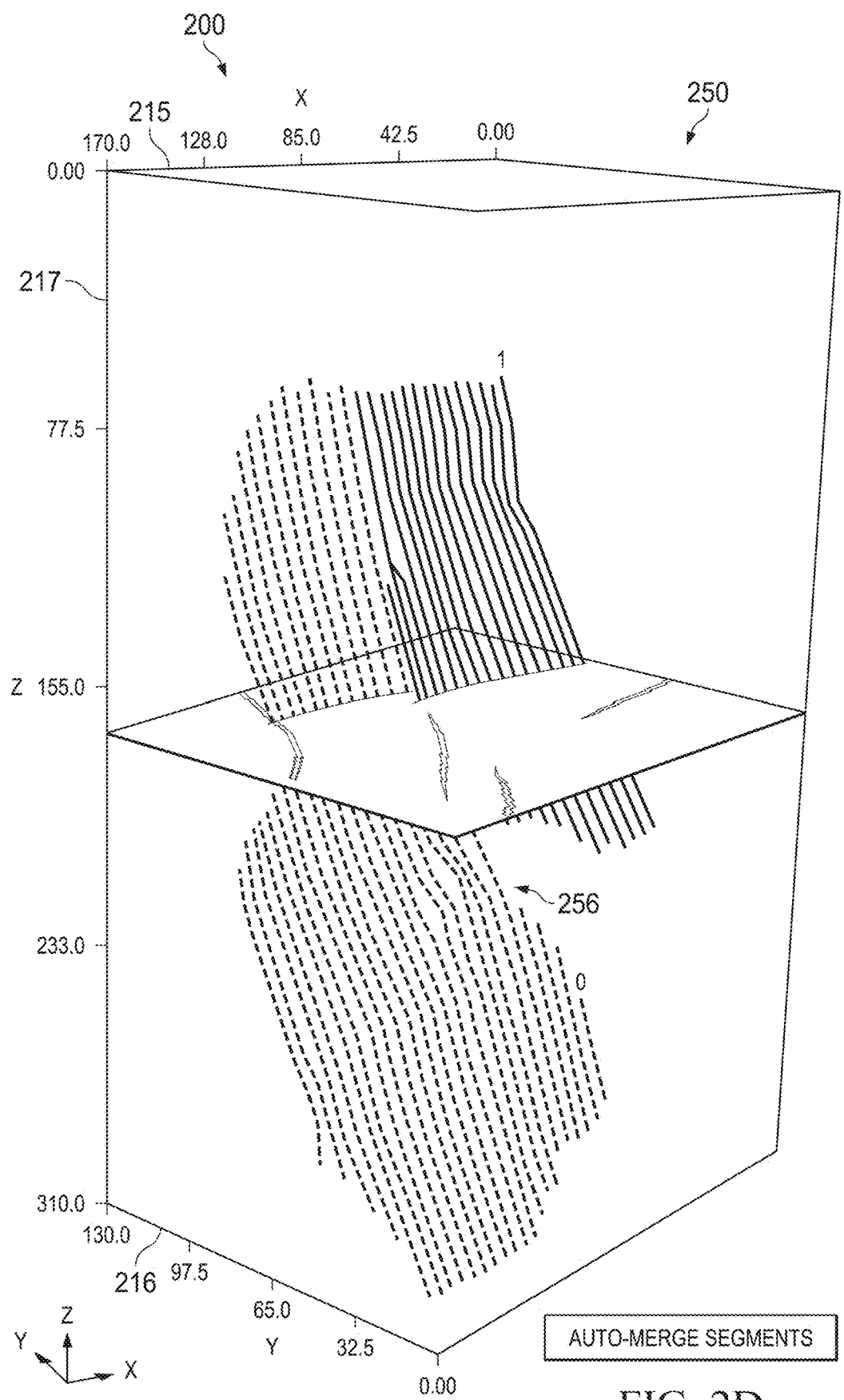

In FIG. 2D, a graph 250 shows the same graphing system as in FIG. 2A. Fault gap 246 has been significantly reduced as shown by merged fault plane 256. By applying an algorithm to the above and below neighboring fault segments, fault gap 246 can be estimated and filled in. For example, fault segment with similar dip and azimuth parameters can be used to fill in the gaps in each assigned fault plane.

Figure 3A:
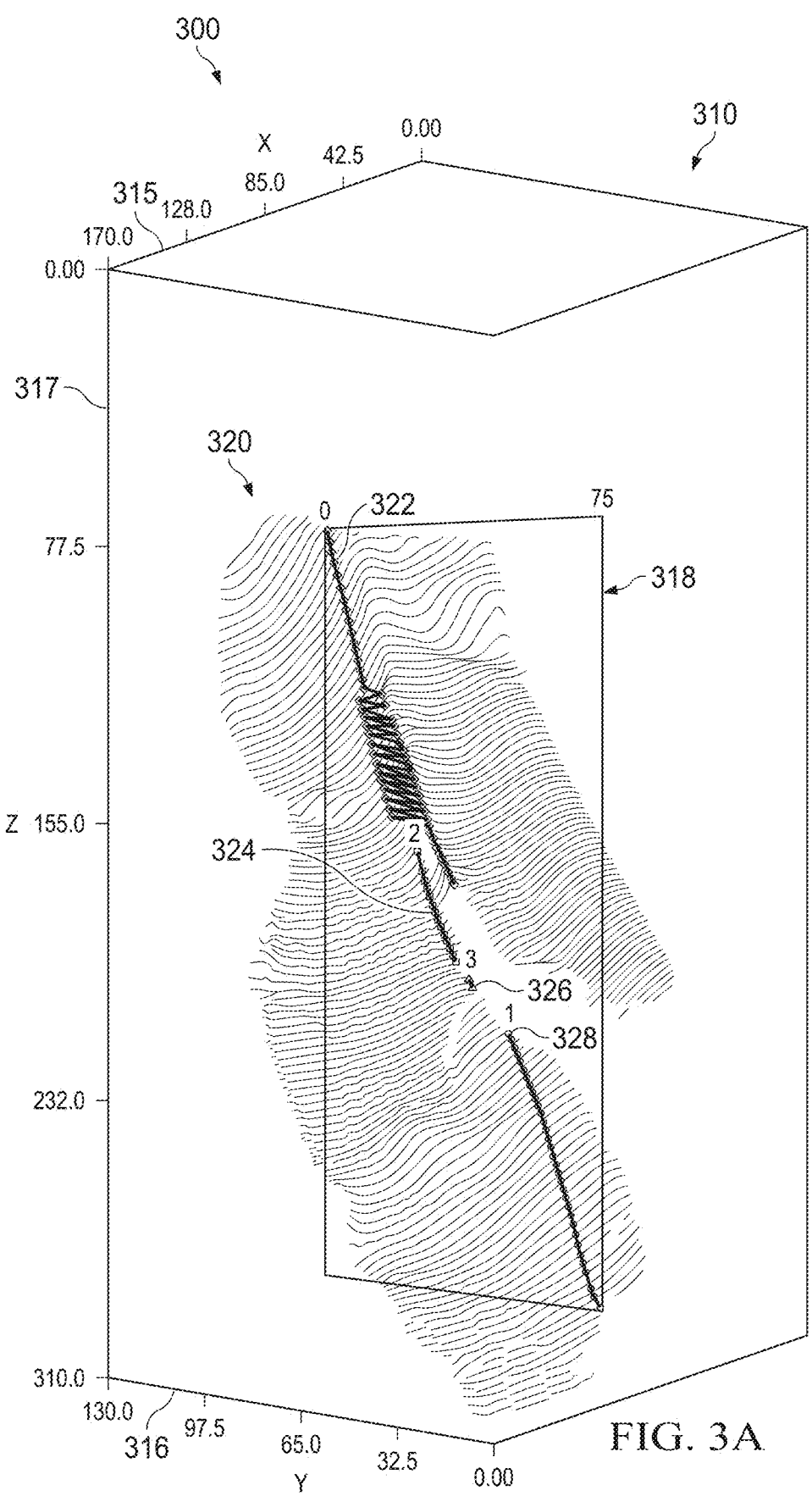
FIGS. 3A-3C are illustrations of diagrams of example graphs demonstrating overlapping and non-overlapping fault segments.
Figure 3B:
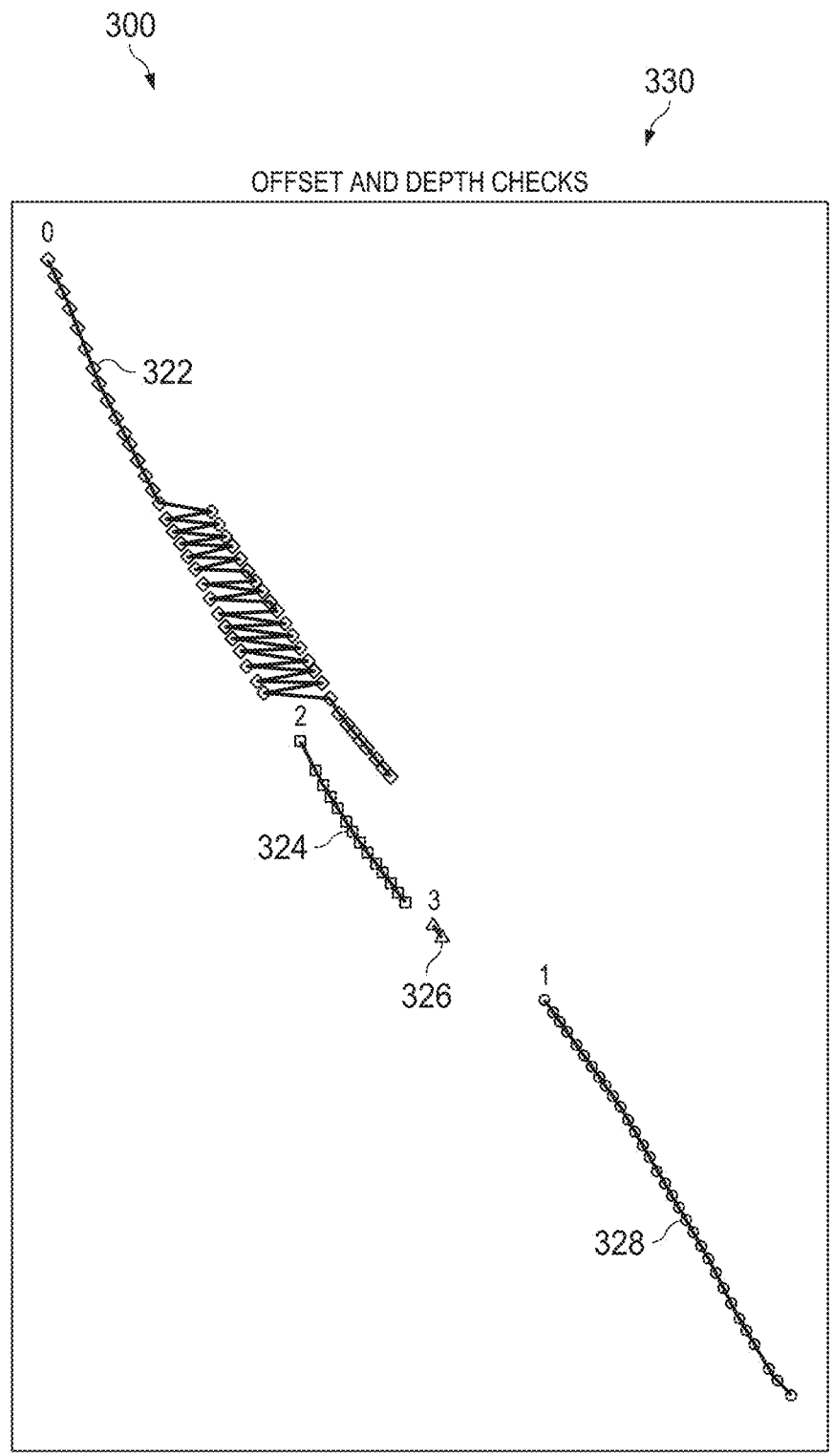
Figure 3C:
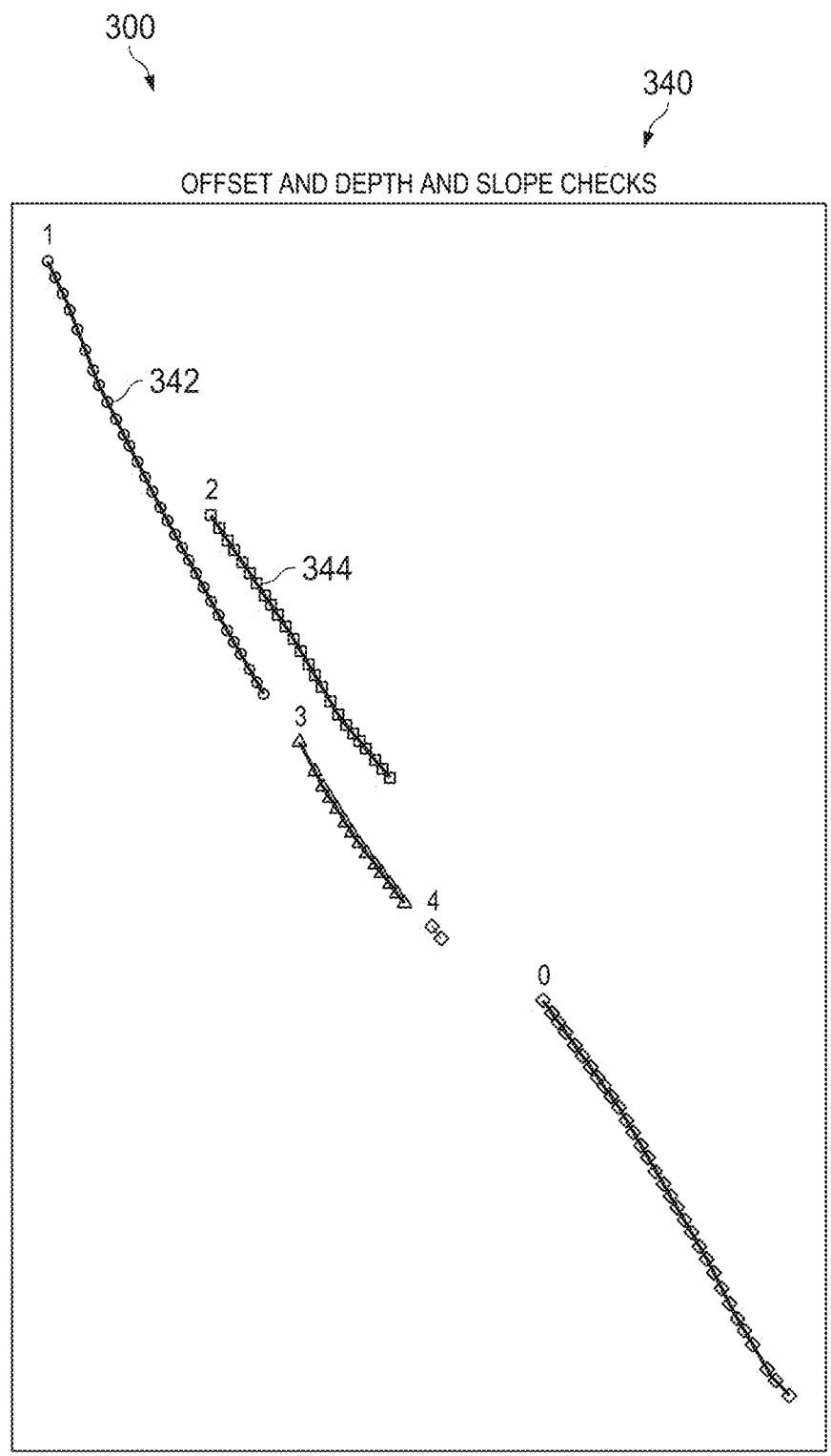

FIG. 3A-3C are illustrations of diagrams of example graphs 300 demonstrating overlapping and non-overlapping fault segments. Graphs 300 has a graph 310 similarly oriented as graph 210 of FIG. 2. Graph 310 has an x-axis 315, using seismic traces as the units along inline direction. A y-axis 316 is shown, using seismic traces as the units along crossline direction. A z-axis 317 is shown, using milliseconds as the units, and which measures the time for the seismic signal to be reflected back to the sensor along a depth direction to the x-axis, e.g., perpendicular to the horizontal slice.

A fault plane pointset 320 is shown on graph 310. The slice of data 318 at inline location 75, are grouped in this example by using input parameters, such as lateral distance, slope, depth, dip, azimuth, or other input parameters. The groupings identify four discreet fault segments, fault segment 322, fault segment 324, fault segment 326, and fault segment 328. These fault segments represent the slopes of the input fault plane pointset along its predominant direction. The input fault plane pointset can be analyzed to determine the predominant direction of the input fault plane, such as using a median value of azimuths from the fault samples. Other algorithms can be used, such as instead of using a median, a mean, an average, or other algorithms can be utilized.

A graph 330 shows fault segment 322, fault segment 324, fault segment 326, and fault segment 328 extracted from graph 310. This extraction can be generated by extracting the slices of fault samples by applying the increment value along the predominant direction of the fault plane pointset.

A graph 340 shows a change in the grouping of the fault samples to form discreet fault segments, as compared to graph 330. Fault segment 322 had two faults, one overlapping the other. Fault segment 322 is separated into a fault segment 342 and a fault segment 344. Fault segment 344 also overlaps fault segment 324. Fault segment 344 was determined to be a separate fault segment from fault segment 322 due to the analysis using the input parameters, such as the offset (maximum lateral distances, e.g., distance parameter), maximum time difference (or depth difference if that type of measurement is being utilized, e.g., time or depth difference parameter), or maximum difference between the slope of the fault samples compared to fault samples local slope (e.g., slope parameter). In some aspects, additional parameters can be utilized, such as a maximum dip difference parameter (e.g., dip parameter) or a maximum azimuth difference parameter (e.g., azimuth parameter). The grouping process can be applied in two broad steps to improve the handling of complex scenarios where the input slice of data contains multiple overlapping fault segments. First, the process can apply offset and depth checks, using the input parameters, to identify key fault segments by vertical and lateral separation, such as shown in graph 330. Second, the process can apply slope checks on each previously generated fault segment to further separate the fault segments into more fault segments, e.g., creating overlapping fault segments such as pairs of overlapping fault segments, as shown in graph 340. This approach can increase the confidence of slope calculations from the combined set of fault segments and therefore can result in higher confidence of the generated fault segments.

Figure 4A:
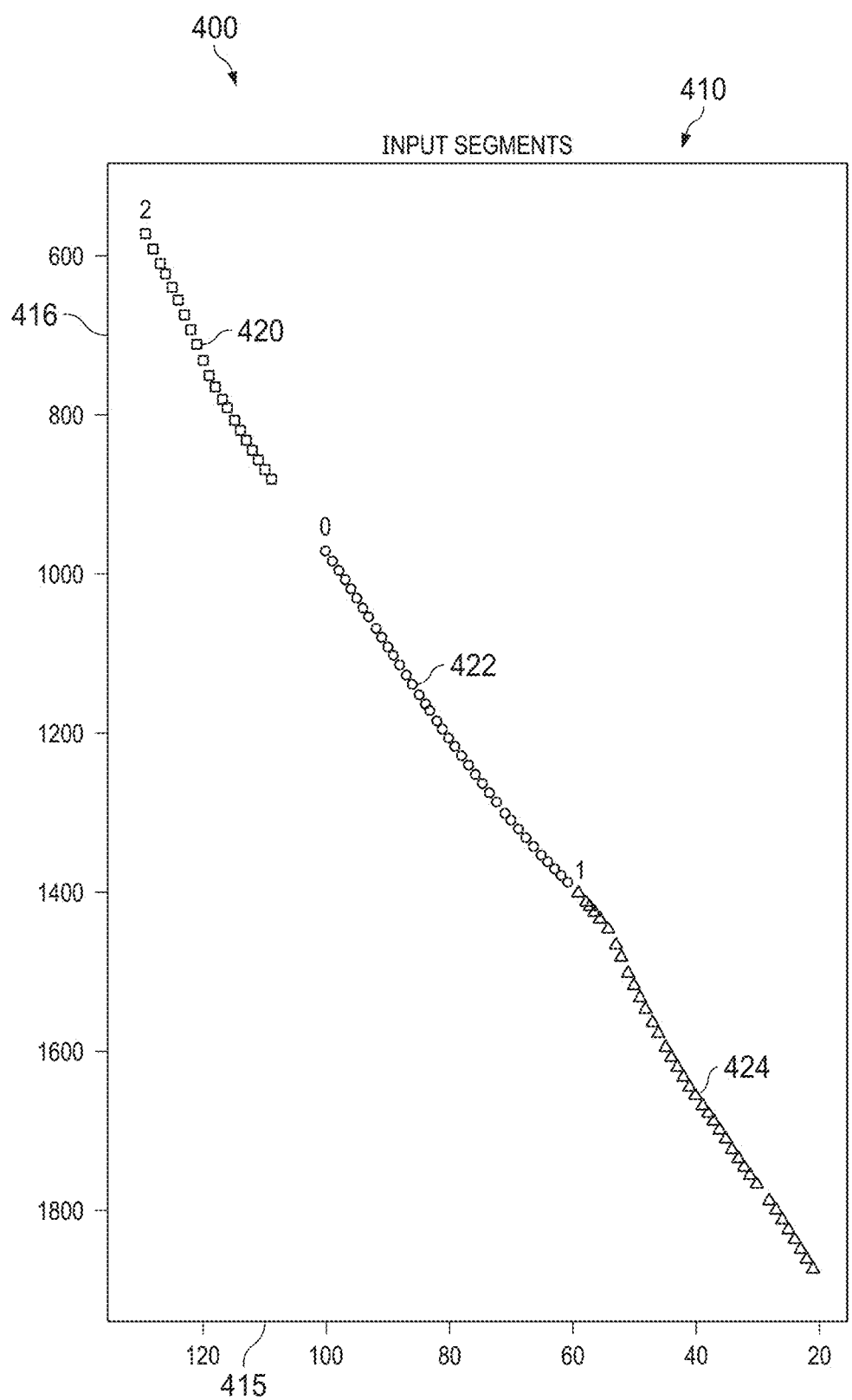
FIGS. 4A-4C are illustrations of diagrams of example graphs demonstrating gap filling with resampled data.
Figure 4B:
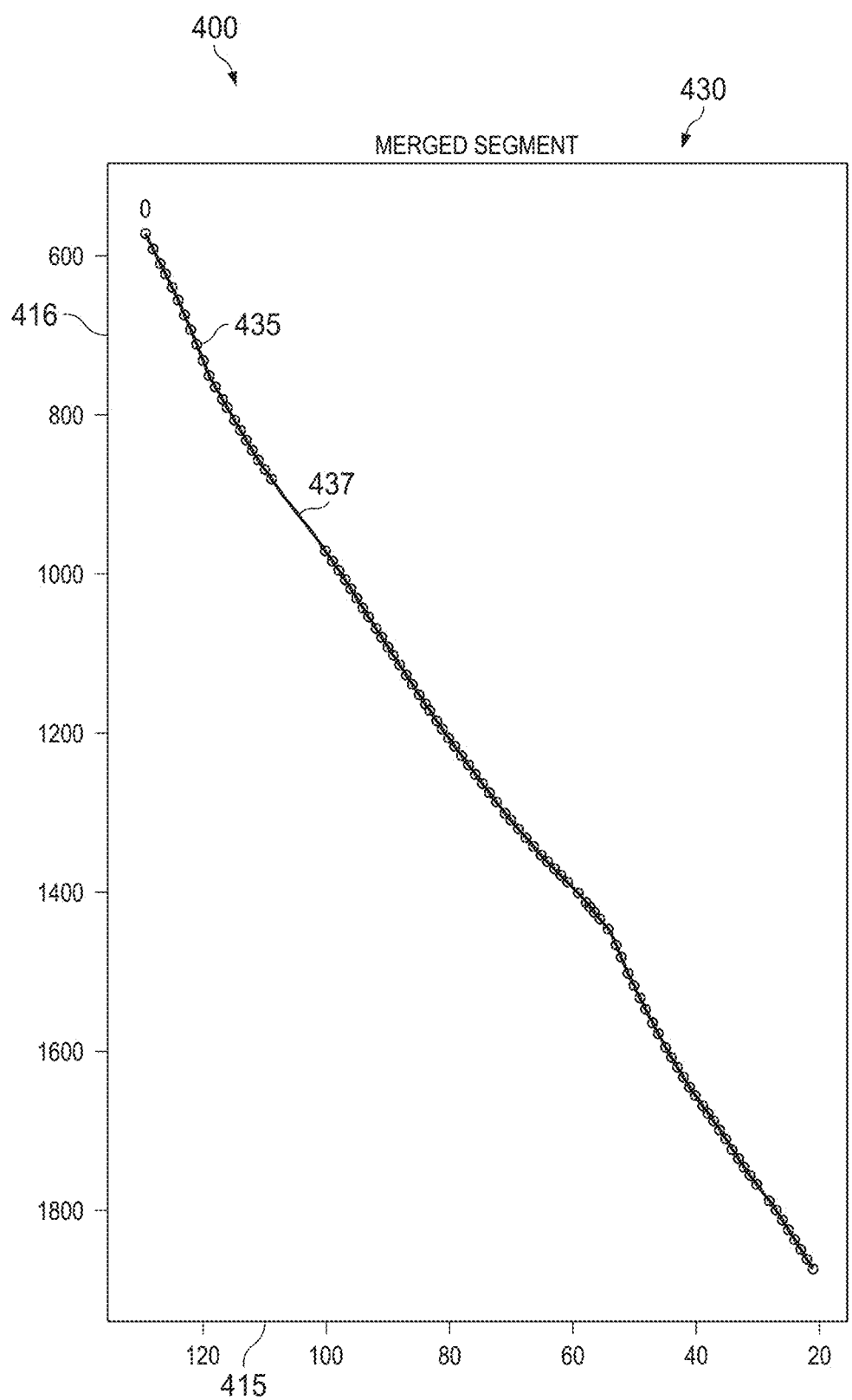
Figure 4C:
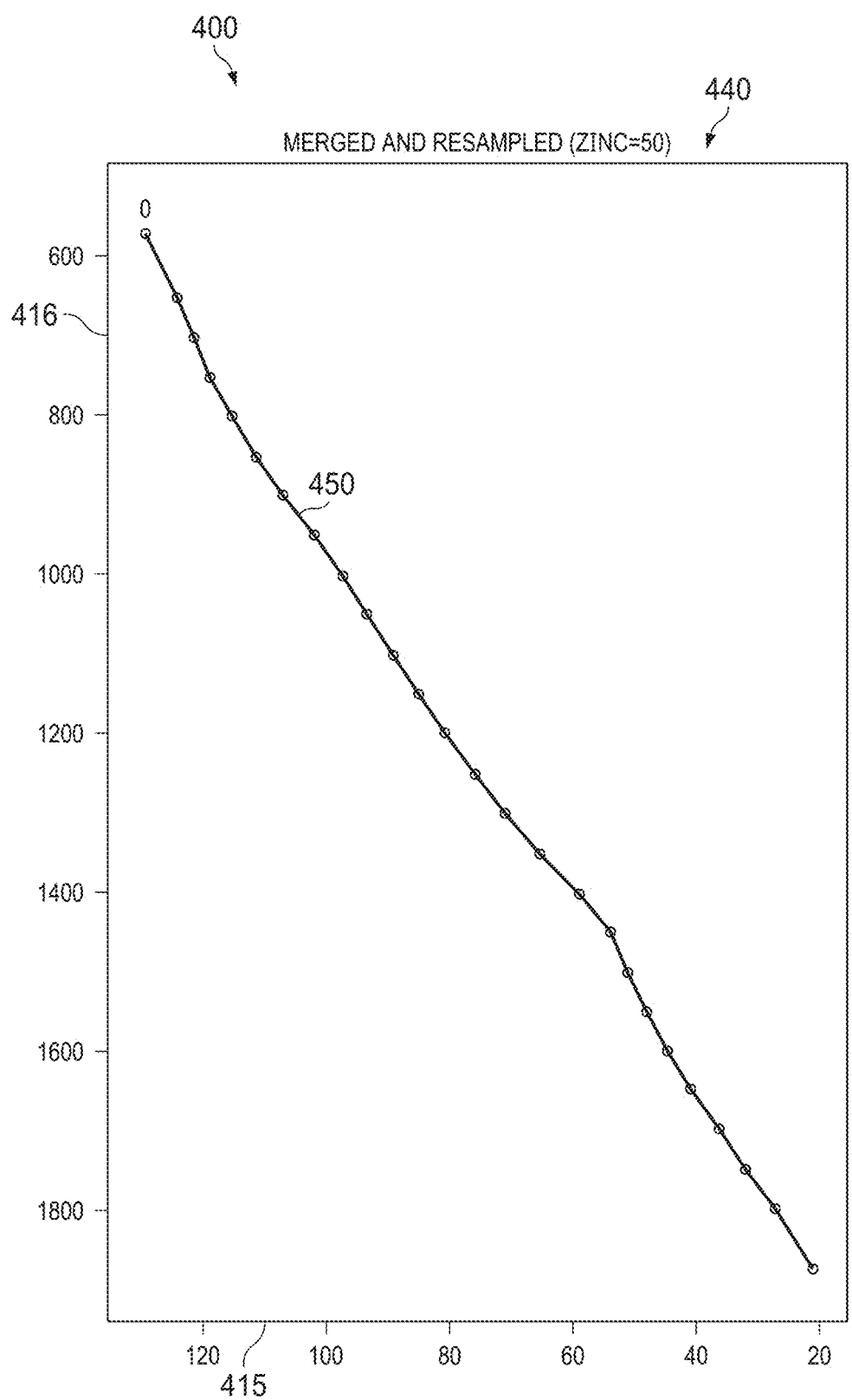

FIGS. 4A-4C are illustrations of diagrams of example graphs 400 demonstrating gap filling with resampled data. Graphs 400 has a graph 410, a graph 430, and a graph 440, each of which is showing a two dimensional view of the fault segments being analyzed. Graph 410 has an x-axis 415 showing the seismic traces as the units. A y-axis 416 shows the time for a seismic wave to be detected by a sensor in an orthogonal orientation to x-axis 415. Graph 430 and graph 440 utilize the same x-axis and y-axis.

Graph 410 has three fault segments, fault segment 420, fault segment 422, and fault segment 424. These fault segments were determined by analyzing the slice of data from fault plane pointset. Graph 430 shows that fault segment 420, fault segment 422, and fault segment 424 have been merged into one fault segment 435. The merge action was determined using the input parameters where the slope, distance, and other parameters satisfy the specified merge criteria.

The gap between fault segment 420 and fault segment 422 remains in graph 430 and is represented by gap 437. Graph 440 demonstrates gap 437 being filled in using an applied algorithm resulting in fault segment 450. A regularization technique using a depth increment parameter from input parameters, e.g., a zinc parameter, can be applied to produce fault segment 450 for further quality control process.

FIGS. 1A, 1B, 1C, 2A, 2B, 2C, 2D, 3A, 3B, 3C, 4A, 4B, and 4C demonstrate the disclosed processes using a visual two-dimensional or three-dimensional graph. A visual component is not needed for the processes and is used herein to explain the processes. The processes can be performed within a computing system using the pointset set data and input parameters.

Figure 5:
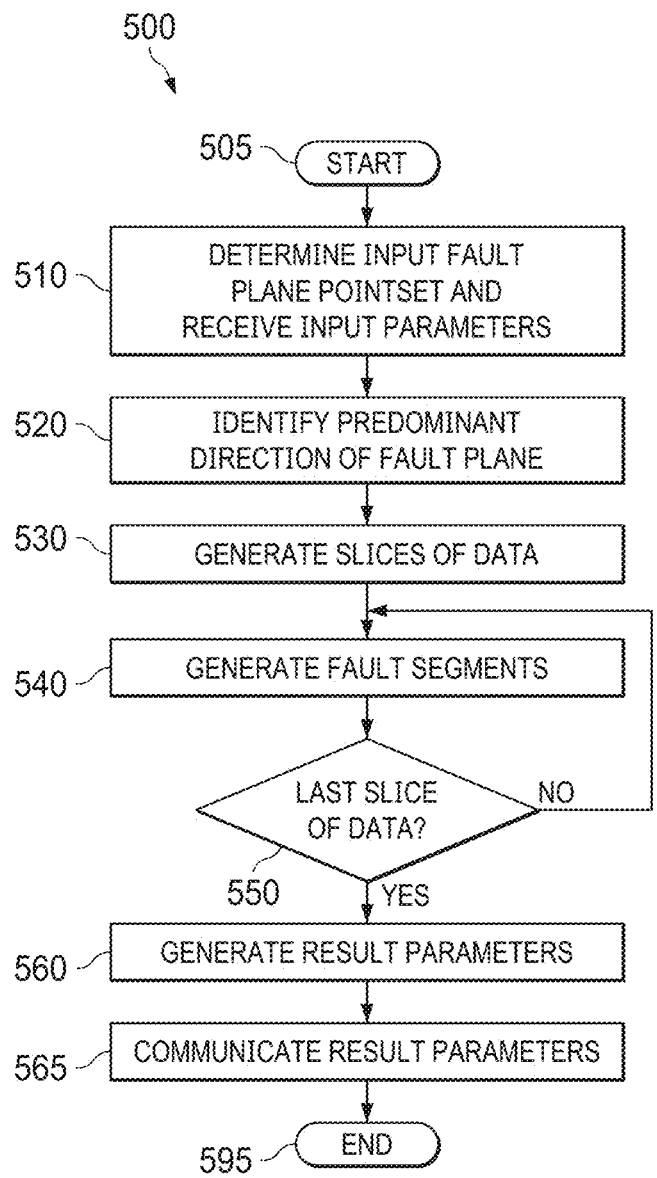
FIG. 5 is an illustration of a flow diagram of an example method to generate fault segments.

FIG. 5 is an illustration of a flow diagram of an example method 500 to generate fault segments. Method 500 can be performed on a computing system, for example, fault segment analyzer system 700 of FIG. 7 or fault segment analyzer controller 800 of FIG. 8. The computing system can be a reservoir controller, a well site controller, a geo-steering system, a data center, a cloud environment, a server, a laptop, a mobile device, smartphone, PDA, or other computing system capable of receiving the formation tester data, input parameters, and capable of communicating with other computing systems. Method 500 can be encapsulated in software code or in hardware, for example, an application, code library, dynamic link library, module, function, RAM, ROM, and other software and hardware implementations. The software can be stored in a file, database, or other computing system storage mechanism, such as an edge computing system. Method 500 can be partially implemented in software and partially in hardware. Method 500 can perform the steps for the described processes, for example, collecting seismic data from the subterranean formation and analyzing the data.

Method 500 starts at a step 505 and proceeds to a step 510. In step 510, the fault plane pointset is received. The fault plane pointset can be received from a datastore, such as a data center, cloud, or edge environment, or the fault plane pointset can be received from the seismic data that is used to generate the fault plane pointset. User specified input parameters can be received. The input parameters can be one or more of an offset parameter (e.g., lateral distance between fault samples), a maximum time or depth difference parameter, a maximum slope parameter, a maximum dip parameter, or a maximum azimuth parameter. The input parameters can be expressed as a percentage or a number. The input parameters indicate the merge criteria for matching similar seismic fault segments. For example, if the maximum slope parameter is 10.0%, then if the difference between two neighboring fault sticks slopes is equal to or less than 10% of one of the slopes, then the two fault sticks can be merged into a single fault segment, as long as the other specified input parameters are also satisfied.

In a step 520, the fault plane pointset, e.g., fault data, can be analyzed to identify the predominant direction of the fault plane. In a step 530, the fault plane pointset is used to generate slices of data applying input parameter trace increment. Each slice of data from the slices data is a set of fault samples from the fault plane pointset follows a single path that are perpendicular to the predominant direction, such as shown in graph 160 of FIG. 1C. This is a way of extracting optimal subsets of fault data points from the fault plane pointset to generate fault segments that represent that slope of the fault plane.

In a step 540, for each slice of data, the fault samples can be analyzed against neighboring fault samples. If a fault sample satisfies the neighbor criteria, which can be the merge criteria, using the input parameters as compared against a neighboring fault sample, then the two fault sample can be grouped together to form a fault segment. In some aspects, the fault sample may be identified as overlapping another fault sample, and they cannot be joined, for example, by using an overlap criteria (see FIG. 3 for details on overlapping and non-overlapping fault samples). If the fault sample cannot be joined to a neighboring fault sample due to not satisfying the overlap criteria, then the fault samples being analyzed can be separated into two or more overlapping grouped fault segments. The fault segment can increase in size as additional fault samples are compared against the fault segment. If a fault sample fails to satisfy the algorithm, then it can be grouped with a separate fault segment. Using this iterative process, one or more fault segments can be identified.

In a decision step 550, a decision can be made whether the last slice of data has been analyzed and no further grouping can take place. If the resultant is 'Yes', then method 500 proceeds to a step 560. If the resultant is 'No', then method 500 proceeds to step 540 where further analysis can be performed. This can effectively iterate each resulting fault sample derived from the slice of data of the fault plane pointset, where each resulting fault sample is used as the primary fault sample for the analyzation using the overlap criteria.

In step 560, the result parameters can be generated consisting of the generated fault segments and grouping parameters used. In some aspects, the result parameters can include interim processing results and merging decisions made, such as locations of where gaps were filled. In some aspects, if at least one overlapping segment has been identified, then the process can proceed to method 600. In a step 565, the result parameters can be communicated to one or more systems or processes, and be used in further decision making. For example, a reservoir controller or a user can utilize the result parameters to plan a drilling operation and drilling path. In other aspects, the result parameter can be communicated to a geo-steering system and used for updating the direction of drilling operations. Method 500 ends at a step 595.

Figure 6:
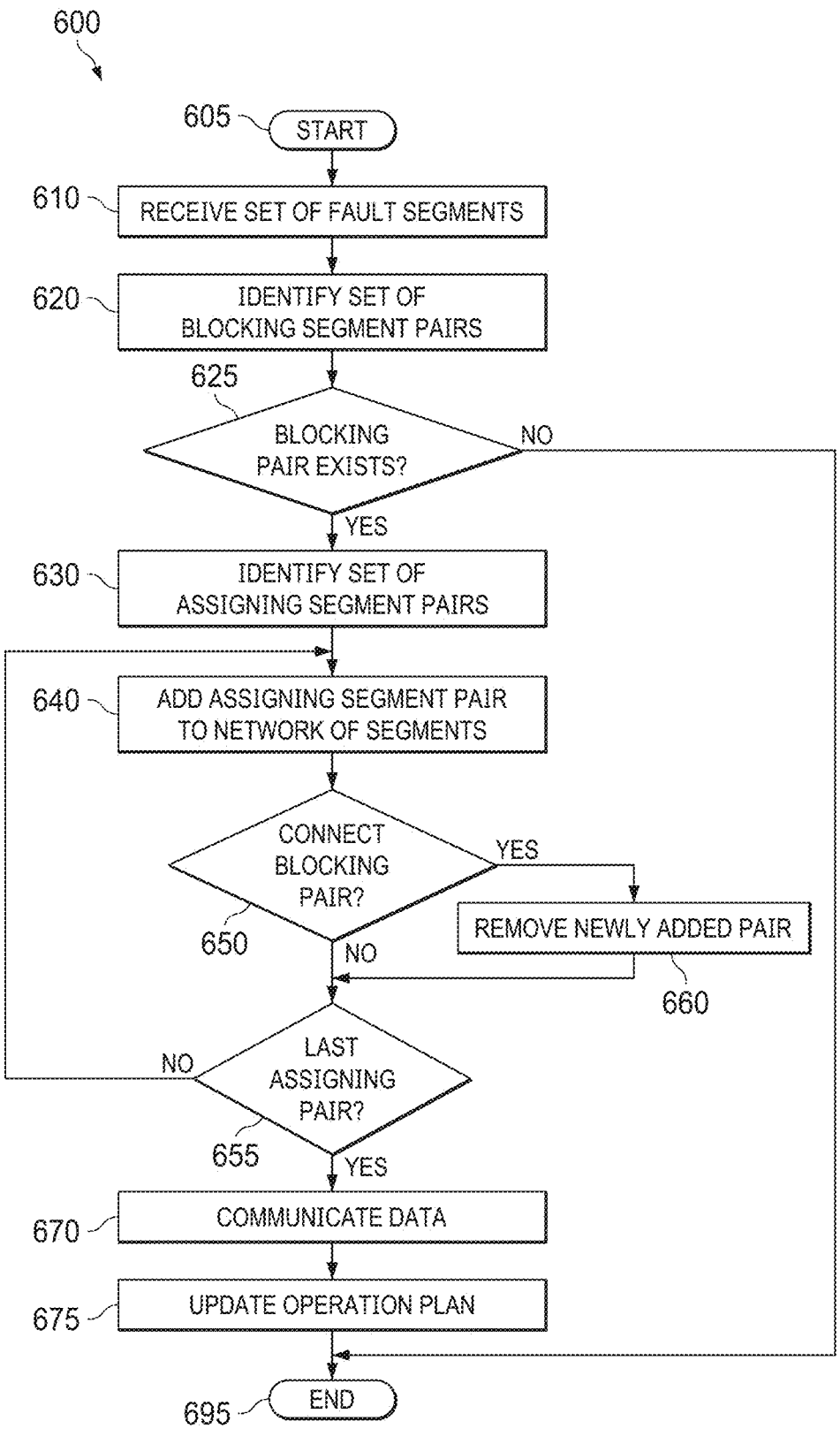
FIG. 6 is an illustration of a flow diagram of an example method to utilizing network analysis to generate one or more sets of fault segments.

FIG. 6 is an illustration of a flow diagram of an example method 600 for utilizing network analysis to generate one or more sets of fault segments. Method 600, similar to method 500, can be performed on a computing system, for example, fault segment analyzer system 700 of FIG. 7 or fault segment analyzer controller 800 of FIG. 8. The computing system can be a reservoir controller, a well site controller, a geo-steering system, a data center, a cloud environment, a server, a laptop, a mobile device, smartphone, PDA, or other computing system capable of receiving the formation tester data, input parameters, and capable of communicating with other computing systems. Method 600 can be encapsulated in software code or in hardware, for example, an application, code library, dynamic link library, module, function, RAM, ROM, and other software and hardware implementations. The software can be stored in a file, database, or other computing system storage mechanism, such as an edge computing system. Method 600 can be partially implemented in software and partially in hardware. Method 600 can perform the steps for the described processes, for example, collecting seismic data from the subterranean formation and analyzing the data.

Method 600 can improve the handling of complex scenarios where the input fault plane pointset contains multiple overlapping fault segments. Method 600 can separate the set of fault segments into two or more subsets of fault segments, wherein each subset of fault segments that doesn't contain overlapping segments represents a fault plane in the subterranean formation.

More specifically, method 600 starts at a step 605 and proceeds to a step 610. In step 610, the set of fault segments can be received. In some aspects, method 600 can receive the set of fault segments as generated in step 560 of method 500. User specified input parameters can be received, where the offset parameter is the same as for method 500.

In a step 620, one or more blocking segment pairs can be identified, forming a set of blocking segment pairs. For example, for each slice of data, pairs of overlapping segments can be identified along the depth axis where they cannot be assigned to the same fault segment, such as by using an overlap criteria. The identified overlapping pairs are referred to as blocking pairs. For example, from graphs 300, fault segment 342 and fault segment 344 is a blocking pair, and fault segment 344 and fault segment 324 is another blocking pair.

In a decision step 625, a check is made whether a blocking or overlapping pair exists. If the resultant is "No", then method 600 proceeds to a step 695 and the input set of fault segments from the input fault plane are returned as the results. If the resultant is "Yes", then the input set of fault segments will be divided into one or more subsets. Method 600 proceeds to step 630.

In a step 630, a set of assigning fault segment pairs can be identified. A fault segment from one slice of data can be compared to another fault segment in a neighboring slice of data. Iterating through each slice of data, each fault segment can be analyzed if it can be correlated to a neighboring fault segment to form an assigning pair. Two fault segments from adjacent two slices of data can be assigned to the same fault plane if they overlap in depth, have a similar shape, and their lateral separation is equal to or less than the offset, e.g., a cutoff value, input parameter. For example, the offset input parameter can be a cutoff value of a trace increment parameter multiplied by a scalar value, such as 1.5. The scalar value can be in the range 1.0 to 2.0 and can be specified as an additional input parameter.

In a step 640, the set of assigning pairs and blocking pairs can be used in a network analysis of fault segments. The outcome of the segment network analysis can be utilized to generate the subsets of fault segments used in the result parameters. For example, if fault segment A correlates to fault segment B and fault segment B correlates to fault segment C, then the fault segments A, B, and C can belong to the same subset of fault segments for purposes of the generation of the result parameters. Each assigning segment pair of the set of assigning pairs will be added as an edge to the network, thereby generating a network of segments. The subsets of fault segments can be extracted as the connected components of a network in which a node is a fault segment, an edge is a pair of assigning fault segments, and connected components satisfy a blocking criteria that they do not contain pairs of blocking segments.

In a decision step 650, a decision is made whether a blocking pair can be connected as being a part of a connected component of the network. If the resultant is 'Yes', then method 600 proceeds to a step 660. If the resultant is 'No', then method 600 proceeds to a decision step 655. In step 660, the last added assigning pair is removed from the network to exclude the overlapping segments from the result connected component.

In decision step 655, a decision can be made on whether the last assigning pair has been reached. If the resultant is 'Yes', then method 600 proceeds to a step 670. If the resultant is 'No', then method 600 proceeds to step 640. In a step 670, the resulting fault segments, as represented by the result parameters, can be communicated to one or more systems or processes, similar to method 500. In a step 675, an operational plan can be updated using the result parameters, such as a drilling operational plan, a geo-steering operational plan, a reservoir operational plan, or other types of operational plans. Method 600 ends at a step 695.

In some aspects, for either method 500 or method 600, there can be an optional step to merge neighboring fault segments to fill in gaps or holes in the fault plane pointset data. This is demonstrated by fault gap 246 and merged fault plane 256 of graphs 200. The continuity of the geological fault can be improved by automatically merging aligned fault segments into a larger fault segment to fill in the gap. If two or more fault segments are non-overlapping and the gap between them is smaller than the maximum height parameter or the gap between them is smaller than a gap height input parameter, then the fault segments can be merged. The maximum height parameter can be the maximum value of the heights of two fault segments above and below the gap. In other aspects, instead of the maximum height parameter, the parameter that can be used can be a minimum value parameter or an average value parameter. In some aspects, a minimum height parameter can be utilized within the algorithm.

The merging can utilize one or more algorithms, such as using an average, a mean, a median, or other merge algorithm to fill in the gap. After the merging has been completed, the fault stick interval can be regularized using a depth increment parameter from the input parameters, as shown in FIG. 4C, which can assist in quality control.

Figure 7:
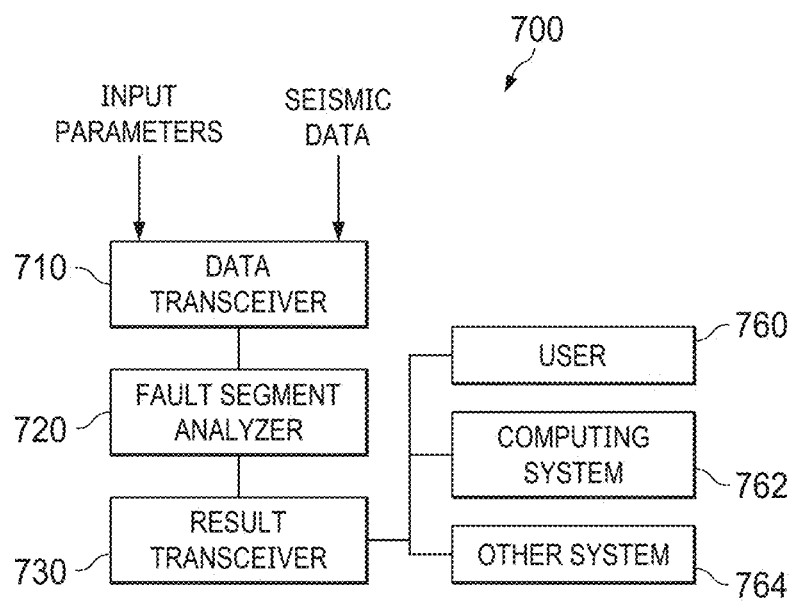
FIG. 7 is an illustration of a block diagram of an example fault segment analyzer system.

FIG. 7 is an illustration of a block diagram of an example fault segment analyzer system 700, which can be implemented in one or more computing systems, for example, a data center, cloud environment, server, laptop, smartphone, tablet, and other computing systems. In some aspects, fault segment analyzer system 700 can be implemented using a fault segment analyzer controller such as fault segment analyzer controller 800 of FIG. 8. Fault segment analyzer system 700 can implement one or more methods of this disclosure, such as method 500 of FIG. 5, and method 600 of FIG. 6.

Fault segment analyzer system 700, or a portion thereof, can be implemented as an application, a code library, a dynamic link library, a function, a module, other software implementation, or combinations thereof. In some aspects, fault segment analyzer system 700 can be implemented in hardware, such as a ROM, a graphics processing unit, or other hardware implementation. In some aspects, fault segment analyzer system 700 can be implemented partially as a software application and partially as a hardware implementation. Fault segment analyzer system 700 is a functional view of the disclosed processes and an implementation can combine or separate the described functions in one or more software or hardware systems.

Fault segment analyzer system 700 includes a data transceiver 710, a fault segment analyzer 720, and a result transceiver 730. The results, e.g., a determination of the fault segments, and interim outputs from fault segment analyzer 720, can be communicated to a data receiver, such as one or more of a user or user system 760, a computing system 762, or other processing or storage systems 764. The results can be used as inputs into a reservoir operation plan, a drilling plan, or to determine the directions provided to a geo-steering system, or used as inputs into a well site controller or other borehole system, such as a well site operation planning system.

Data transceiver 710 can receive input parameters, such as parameters to direct the operation of the analysis implemented by fault segment analyzer 720, such as algorithms to utilize, an offset parameter, a maximum time/depth difference parameter, a maximum slope parameter, a maximum dip parameter, a maximum azimuth parameter, or maximum height parameter. In some aspects, data transceiver 710 can be part of fault segment analyzer 720.

Result transceiver 730 can communicate one or more results, analysis, or interim outputs, to one or more data receivers, such as user or user system 760, computing system 762, storage system 764, e.g., a data store or database, or other related systems, whether located proximate result transceiver 730 or distant from result transceiver 730. Data transceiver 710, fault segment analyzer 720, and result transceiver 730 can, or can include, conventional interfaces configured for transmitting and receiving data. In some aspects, fault segment analyzer 720 can be a machine learning system, such as providing a process to analyze the collected fault plane pointset against previously collected data to provide a quality check on the data and to fill in a gap in the data.

Fault segment analyzer 720 can implement the analysis and algorithms as described herein utilizing the fault plane pointset data and the input parameters. For example, fault segment analyzer 720 can perform the analysis of the fault plane pointset to automatically generate the final fault segments, and communicate the results to other systems, such as a reservoir planning system, a drilling planning system, a geo-steering system, or other well site systems.

A memory or data storage of fault segment analyzer 720 can be configured to store the processes and algorithms for directing the operation of fault segment analyzer 720. Fault segment analyzer 720 can also include a processor that is configured to operate according to the analysis operations and algorithms disclosed herein, and an interface to communicate (transmit and receive) data.

Figure 8:
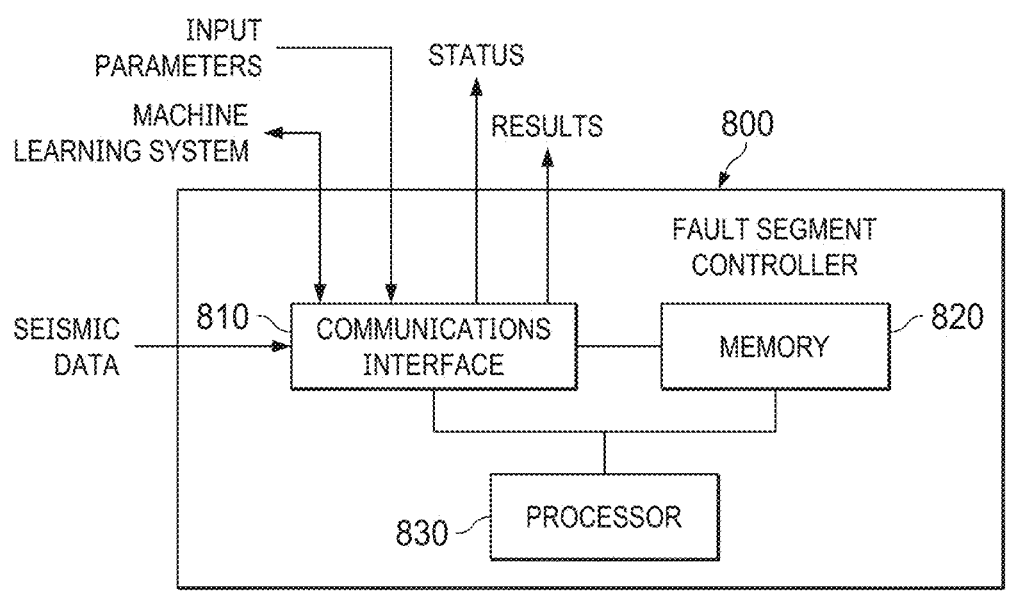
FIG. 8 is an illustration of a block diagram of an example of fault segment analyzer controller according to the principles of the disclosure.

FIG. 8 is an illustration of a block diagram of an example of fault segment analyzer controller 800 according to the principles of the disclosure. Fault segment analyzer controller 800 can be stored on a single computer or on multiple computers. The various components of fault segment analyzer controller 800 can communicate via wireless or wired conventional connections. A portion or a whole of fault segment analyzer controller 800 can be located at one or more locations, such as a data center, a reservoir controller, an edge computing system, a cloud environment, or other locations. In some aspects, fault segment analyzer controller 800 can be wholly located at a surface or distant location. In some aspects, fault segment analyzer controller 800 can be part of another system, and can be integrated in a single device, such as a part of a reservoir operation planning system, a well site controller, a geo-steering system, or other borehole system.

Fault segment analyzer controller 800 can be configured to perform the various processes disclosed herein including receiving input parameters and collected data, and generating results from an execution of the methods and processes described herein, such as generating final fault segments. Fault segment analyzer controller 800 includes a communications interface 810, a memory 820, and a processor 830.

Communications interface 810 is configured to transmit and receive data. For example, communications interface 810 can receive the input parameters, and fault plane pointset data. Communications interface 810 can transmit the generated results, data from the input files, or interim outputs. In some aspects, communications interface 810 can transmit a status, such as a success or failure indicator of fault segment analyzer controller 800 regarding receiving the various inputs, transmitting the generated results, or producing the generated results.

In some aspects, communications interface 810 can receive input parameters from a machine learning system, for example, where the fault plane pointset data is processed using one or more filters and algorithms prior to determining the fault segments.

In some aspects, the machine learning system can be implemented by processor 830 and perform the operations as described by fault segment analyzer 720. Communications interface 810 can communicate via communication systems used in the industry. For example, wireless or wired protocols can be used. Communication interface 810 is capable of performing the operations as described for data transceiver 710 and result transceiver 730 of FIG. 7.

Memory 820 can be configured to store a series of operating instructions that direct the operation of processor 830 when initiated, including the code representing the algorithms for determining processing the collected data. Memory 820 is a non-transitory computer readable medium. Multiple types of memory can be used for data storage and memory 820 can be distributed.

Processor 830, e.g., a fault segment processor, can be configured to produce the generated results, e.g., the fault segments, one or more interim outputs, and statuses utilizing the received inputs. Processor 830 can be configured to direct the operation of fault segment analyzer controller 800. Processor 830 includes the logic to communicate with communications interface 810 and memory 820, and perform the functions described herein. Processor 830 is capable of performing or directing the operations as described by fault segment analyzer 720 of FIG. 7.

A portion of the above-described apparatus, systems or methods may be embodied in or performed by various analog or digital data processors, wherein the processors are programmed or store executable programs of sequences of software instructions to perform one or more of the steps of the methods. A processor may be, for example, a programmable logic device such as a programmable array logic (PAL), a generic array logic (GAL), a field programmable gate arrays (FPGA), or another type of computer processing device (CPD). The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed examples or embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floppy disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

Each of the aspects disclosed in the SUMMARY can have one or more of the following additional elements in combination. Element 1: communicating, using a result transceiver, the one or more subsets of fault segments to a reservoir system, a drilling system, a geo-steering system, or a well site system. Element 2: wherein the one or more subsets of fault segments are utilized to updated a drilling plan of a borehole. Element 3: comparing a first fault sample with a neighboring fault sample, using the input parameters, and wherein the first fault sample and the neighboring fault sample are derived from a slice of data of the fault plane pointset, and where the neighboring fault sample is within an offset parameter of the first fault sample. Element 4: grouping the first fault sample with the neighboring fault sample when a neighbor criteria is satisfied to form a grouped fault segment. Element 5: separating the grouped fault segment into two or more overlapping grouped fault segments when the first fault sample is identified as overlapping, using an overlap criteria, other fault samples within the grouped fault segment. Element 6: adding the grouped fault segment or the two or more overlapping grouped fault segments to the one or more subsets of fault segments as a new subset of fault segments or combining with an existing subset of fault segments. Element 7: iterating each resulting fault sample derived from the slice of data of the fault plane pointset, where each resulting fault sample is a respective first fault sample. Element 8: wherein there are zero pairs of overlapping fault segments and one subset of fault segments is generated. Element 9: wherein the fault segment processor utilizes a network analysis algorithm to generate the one or more subsets of fault segments, where each node of a network of segments is an identified fault segment of the one or more subsets of fault segments, and each edge of the network of segments is a pair of assigning fault segments, where each connected component of the network of segments is a subset of the set of fault segments that does not contain a pair of overlapping fault segments. Element 10: filling in a gap between a first fault segment and a second fault segment, from the set of fault segments, utilizing a regularization technique and a depth increment parameter, wherein the depth increment parameter is satisfied using the first fault segment and the second fault segment. Element 11: wherein the depth increment parameter is one of a maximum height parameter, a minimum height parameter, an average parameter, a median parameter, or a mean parameter. Element 12: wherein the input parameters are one or more of an algorithm to utilize, an offset parameter, a maximum time difference parameter, a maximum distance difference parameter, a maximum slope parameter, a maximum dip parameter, a maximum azimuth parameter, a gap height parameter, a depth increment parameter, or a maximum height parameter. Element 13: a machine learning system, capable of communicating with the data transceiver and the fault segment processor, performing an analysis of the fault plane pointset, and generating a modified fault plane pointset. Element 14: a result transceiver, capable of communicating results, interim outputs, and the one or more subsets of fault segments to a user system, a data store, or a computing system. Element 15: wherein the computing system is a geo-steering system and the geo-steering system utilizes the one or more subsets of fault segments to adjust drilling operations. Element 16: wherein the computing system is a reservoir controller and the reservoir controller utilizes the one or more subsets of fault segments to adjust a drilling path or to adjust a reservoir operation plan. Element 17: wherein the fault segment processor is further capable of identifying a first subset of fault segments overlapping a second subset of fault segments and assign the first subset of fault segments to a different subset of fault segments from the second subset of fault segments. Element 18: wherein the fault segment processor utilizes a network analysis algorithm using a regularization technique and a depth increment parameter, where each node of a network generated using the network analysis algorithm is a fault segment of the set of fault segments, and each edge of the network is a pair of assigning fault segments. Element 19: wherein the fault segment processor is further capable of filling in a gap between a first fault segment and a second fault segment, from the set of fault segments, where a criteria is satisfied comparing the first fault segment and the second fault segment. Element 20: communicating the one or more subsets of fault segments to a reservoir system, a drilling system, a geo-steering system, or a well site system. Element 21: wherein the fault segment processor utilizes a network analysis algorithm to generate the one or more subsets of fault segments. Element 22: where each node of a network of segments is an identified fault segment of the one or more subsets of fault segments. Element 23: each edge of the network of segments is a pair of assigning fault segments. Element 24: where each connected component of the network of segments is a subset of the set of fault segments that does not contain a pair of overlapping fault segments. Element 25: wherein the network analysis algorithm includes identifying at least one blocking pair of fault segments in the set of fault segments. Element 26: wherein the network analysis algorithm includes identifying a set of assigning fault segment pairs in the set of fault segments. Element 27: wherein the network analysis algorithm includes adding the set of assigning fault segment pairs to the network of segments. Element 28: wherein the network analysis algorithm includes connecting the at least one blocking pair to other pairs of the network of segment where the at least one blocking pair satisfies the blocking criteria specified in the input parameters.

What is claimed is:

1. A method, comprising:
receiving a fault plane pointset and input parameters, wherein the fault plane pointset is information collected from a seismic volume, and the fault plane pointset represents a portion of a subterranean formation;
identifying a predominant fault plane direction using the fault plane pointset;
ascertaining a fault plane slope of the predominant fault plane direction;
generating a set of fault segments wherein the set of fault segments are generated using the input parameters, the fault plane slope, and slices of data from the fault plane pointset that are perpendicular to the predominant fault plane direction;
using a fault segment processor to determine existence of zero or more pairs of overlapping fault segments and generate one or more subsets of fault segments using the set of fault segments and the input parameters, wherein each subset of fault segments in the one or more subsets of fault segments represents a fault plane in the subterranean formation, where two or more fault segments from the set of fault segments are assigned to form a subset of fault segments, and the two or more fault segments satisfy a merge criteria specified in the input parameters; and
filling in at least one gap between two fault segments in the one or more subsets of fault segments, wherein the two fault segments each have a slope, a dip value, and an azimuth value where each one of the slope, the dip value, and the azimuth value are within a merge criteria for matching similar seismic fault segments.

2. The method as recited in claim 1, further comprising:
communicating, using a result transceiver, the one or more subsets of fault segments to a reservoir system, a drilling system, a geo-steering system, or a well site system.

3. The method as recited in claim 1, wherein the one or more subsets of fault segments are utilized to updated a drilling plan of a borehole.

4. The method as recited in claim 1, wherein using the fault segment processor further comprises:
comparing a first fault sample with a neighboring fault sample, using the input parameters, and wherein the first fault sample and the neighboring fault sample are derived from a slice of data of the fault plane pointset, and where the neighboring fault sample is within an offset parameter of the first fault sample;
grouping the first fault sample with the neighboring fault sample when a neighbor criteria is satisfied to form a grouped fault segment;
separating the grouped fault segment into two or more overlapping grouped fault segments when the first fault sample is identified as overlapping, using an overlap criteria, other fault samples within the grouped fault segment;
adding the grouped fault segment or the two or more overlapping grouped fault segments to the one or more subsets of fault segments as a new subset of fault segments or combining with an existing subset of fault segments; and
iterating each resulting fault sample derived from the slice of data of the fault plane pointset, where each resulting fault sample is a respective first fault sample.

5. The method as recited in claim 1, wherein there are zero pairs of overlapping fault segments and one subset of fault segments is generated.

6. The method as recited in claim 1, wherein the fault segment processor utilizes a network analysis algorithm to generate the one or more subsets of fault segments, where each node of a network of segments is an identified fault segment of the one or more subsets of fault segments, and each edge of the network of segments is a pair of assigning fault segments, where each connected component of the network of segments is a subset of the set of fault segments that does not contain a pair of overlapping fault segments.

7. The method as recited in claim 6, wherein the network analysis algorithm further comprises:
identifying at least one blocking pair of fault segments in the set of fault segments;
identifying a set of assigning fault segment pairs in the set of fault segments;
adding the set of assigning fault segment pairs to the network of segments; and connecting the at least one blocking pair to other pairs of the network of segments where the at least one blocking pair satisfies the blocking criteria specified in the input parameters.

8. The method as recited in claim 1, further comprising: filling in a gap between a first fault segment and a second fault segment, from the set of fault segments, utilizing a regularization technique and a depth increment parameter, wherein the depth increment parameter is satisfied using the first fault segment and the second fault segment.

9. The method as recited in claim 8, wherein the depth increment parameter is one of a maximum height parameter, a minimum height parameter, an average parameter, a median parameter, or a mean parameter.

10. The method as recited in claim 1, wherein the input parameters are one or more of an algorithm to utilize, an offset parameter, a maximum time difference parameter, a maximum distance difference parameter, a maximum slope parameter, a maximum dip parameter, a maximum azimuth parameter, a gap height parameter, a depth increment parameter, or a maximum height parameter.

11. A system, comprising:
a data transceiver, capable of receiving a fault plane pointset and input parameters, wherein the fault plane pointset is data collected from one or more seismic sensors of a subterranean formation; and
a fault segment processor, capable of communicating with the data transceiver, identifying a direction of a predominant fault plane of the fault plane pointset, ascertaining a fault plane slope of the predominant fault plane direction, generating a set of fault segments using the input parameters, the fault plane slope, and slices of data from the fault plane pointset that are perpendicular to the predominant fault plane direction, and generating one or more subsets of fault segments using the set of fault segments and the input parameters, wherein each subset of fault segments in the one or more subsets of fault segments represents a fault plane in the subterranean formation, where two or more fault segments from the set of fault segments are assigned to form a subset of the one or more subsets of fault segments, the two or more fault segments satisfy a merge criteria specified in the input parameters; and filling in at least one gap between two fault segments in the one or more subsets of fault segments, wherein the two fault segments each have a slope, a dip value, and an azimuth value where each one of the slope, the dip value, and the azimuth value are within a merge criteria for matching similar seismic fault segments.

12. The system as recited in claim 11, further comprising:
a machine learning system, capable of communicating with the data transceiver and the fault segment processor, performing an analysis of the fault plane pointset, and generating a modified fault plane pointset.

13. The system as recited in claim 11, further comprising:
a result transceiver, capable of communicating results, interim outputs, and the one or more subsets of fault segments to a user system, a data store, or a computing system.

14. The system as recited in claim 13, wherein the computing system is a geo-steering system and the geo-steering system utilizes the one or more subsets of fault segments to adjust drilling operations.

15. The system as recited in claim 13, wherein the computing system is a reservoir controller and the reservoir controller utilizes the one or more subsets of fault segments to adjust a drilling path or to adjust a reservoir operation plan.

16. The system as recited in claim 11, wherein the fault segment processor is further capable of identifying a first subset of fault segments overlapping a second subset of fault segments and assign the first subset of fault segments to a different subset of fault segments from the second subset of fault segments.

17. The system as recited in claim 11, wherein the fault segment processor utilizes a network analysis algorithm using a regularization technique and a depth increment parameter, where each node of a network generated using the network analysis algorithm is a fault segment of the set of fault segments, and each edge of the network is a pair of assigning fault segments.

18. The system as recited in claim 11, wherein the fault segment processor is further capable of filling in a gap between a first fault segment and a second fault segment, from the set of fault segments, where a criteria is satisfied comparing the first fault segment and the second fault segment.

19. A computer program product having a series of operating instructions stored on a non-transitory computer-readable medium that directs a data processing apparatus when executed thereby to perform operations to determine one or more fault segments, the operations comprising:
receiving a fault plane pointset and input parameters, wherein the fault plane pointset is information collected from a seismic volume, and the fault plane pointset represents a portion of a subterranean formation;
identifying a predominant fault plane direction using the fault plane pointset;
ascertaining a fault plane slope of the predominant fault plane direction;
generating a set of fault segments wherein the set of fault segments are generated using the input parameters, the fault plane slope, and slices of data from the fault plane pointset that are perpendicular to the predominant fault plane direction;
directing a fault segment processor to determine existence of zero or more pairs of overlapping fault segments and generate one or more subsets of fault segments using the set of fault segments and the input parameters, wherein each subset of fault segments in the one or more subsets of fault segments represents a fault plane in the subterranean formation, where two or more fault segments from the set of fault segments are assigned to form a subset of fault segments, and the two or more fault segments satisfy criteria specified in the input parameters; and
filling in at least one gap between two fault segments in the one or more subsets of fault segments, wherein the two fault segments each have a slope, a dip value, and an azimuth value where each one of the slope, the dip value, and the azimuth value are within a merge criteria for matching similar seismic fault segments.

20. The computer program product as recited in claim 19, further comprising:
communicating the one or more subsets of fault segments to a reservoir system, a drilling system, a geo-steering system, or a well site system.

21. The computer program product as recited in claim 19, wherein the fault segment processor utilizes a network analysis algorithm to generate the one or more subsets of fault segments, where each node of a network of segments is an identified fault segment of the one or more subsets of fault segments, and each edge of the network of segments is a pair of assigning fault segments, where each connected component of the network of segments is a subset of the set of fault segments that does not contain a pair of overlapping fault segments.

22. The computer program product as recited in claim 21, wherein the network analysis algorithm comprises:
- identifying at least one blocking pair of fault segments in the set of fault segments;
- identifying a set of assigning fault segment pairs in the set of fault segments;
- adding the set of assigning fault segment pairs to the network of segments; and
- connecting the at least one blocking pair to other pairs of the network of segment where the at least one blocking pair satisfies the blocking criteria specified in the input parameters.

23. The computer program product as recited in claim 19, further comprising:
- filling in a gap between a first fault segment and a second fault segment, from the set of fault segments, utilizing a regularization technique and a depth increment parameter, wherein the depth increment parameter is satisfied using the first fault segment and the second fault segment.

* * * * *